(12) United States Patent
Cansancao et al.

(10) Patent No.: US 12,399,520 B2
(45) Date of Patent: Aug. 26, 2025

(54) PHASOR MEASUREMENT UNITS, SYNCHROPHASOR SYSTEMS AND METHODS THEREOF

(71) Applicant: Electro Industries/Gauge Tech, Westbury, NY (US)

(72) Inventors: Dulciane Siqueira Cansancao, Olinda (BR); Hai Zhu, Hauppauge, NY (US); Erran Kagan, Great Neck, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 431 days.

(21) Appl. No.: 17/879,639

(22) Filed: Aug. 2, 2022

(65) Prior Publication Data

US 2023/0042887 A1    Feb. 9, 2023

Related U.S. Application Data

(63) Continuation-in-part of application No. 16/888,975, filed on Jun. 1, 2020, now abandoned, which is a
(Continued)

(51) Int. Cl.
*G05F 1/625* (2006.01)
*G01R 19/25* (2006.01)
(Continued)

(52) U.S. Cl.
CPC ......... *G05F 1/625* (2013.01); *G01R 19/2513* (2013.01); *G01R 25/02* (2013.01);
(Continued)

(58) Field of Classification Search
CPC ....... G06F 1/625; G06F 1/66; G01R 19/2513; G01R 25/02; G05B 15/02; G05B 23/02;
(Continued)

(56) References Cited

U.S. PATENT DOCUMENTS 3,491,248 A   1/1970   Beckwith et al.
4,218,625 A   8/1980   Beckwith et al.
(Continued)

FOREIGN PATENT DOCUMENTS

KR    20080071259 A   *   8/2008

OTHER PUBLICATIONS

ABB AG Power Technology Systems, Plant Electrical Systems, 2005, ABB pp. 1-6.
(Continued)

*Primary Examiner* — Kidest Bahta
(74) *Attorney, Agent, or Firm* — Robinson + Cole LLP

(57) ABSTRACT

A phasor measurement unit (PMU) of the present disclosure measures phasor, i.e., magnitude and phase angle of voltage and current, and related data from a specific location on the electrical gird synchronized to a common time source. The time-synchronized phasor is called a synchrophasor. In a system of the present disclosure, a plurality of PMUs transmit the synchrophasors and related data to a phasor data concentrator (PDC), which aggregates and time-aligns the data for real time and post analysis. The PMU of the present disclosure further functions as a power quality meter determining at least one of symmetrical components' phasor, frequency, rate of change of frequency, high-speed digital inputs, analog fundamental power and/or displacement power factor.

20 Claims, 20 Drawing Sheets

Synchrophasor Representation

Related U.S. Application Data continuation of application No. 14/851,661, filed on Sep. 11, 2015, now Pat. No. 10,671,106, which is a continuation of application No. 13/439,333, filed on Apr. 4, 2012, now Pat. No. 9,136,711.

(60) Provisional application No. 63/390,310, filed on Jul. 19, 2022.

(51) Int. Cl.

| | | |
|---|---|---|
| *G01R 25/02* | (2006.01) | |
| *G05B 15/02* | (2006.01) | |
| *G05F 1/66* | (2006.01) | |
| *H02J 3/08* | (2006.01) | |
| *H02J 3/34* | (2006.01) | |
| *H02J 3/38* | (2006.01) | |
| *H02J 3/40* | (2006.01) | |
| *H02J 3/42* | (2006.01) | |
| *G05B 23/02* | (2006.01) | |
| *H02J 3/06* | (2006.01) | |
| *H02J 13/00* | (2006.01) | |
| *H05B 47/19* | (2020.01) | |

(52) U.S. Cl.
CPC .............. *G05B 15/02* (2013.01); *G05F 1/66* (2013.01); *H02J 3/08* (2013.01); *H02J 3/34* (2013.01); *H02J 3/38* (2013.01); *H02J 3/40* (2013.01); *H02J 3/42* (2013.01); *G05B 23/02* (2013.01); *H02J 3/06* (2013.01); *H02J 13/00009* (2020.01); *H05B 47/19* (2020.01)

(58) Field of Classification Search
CPC ........ H02J 3/08; H02J 3/34; H02J 3/38; H02J 3/40; H02J 3/42; H02J 3/06; H02J 13/00009; H02J 3/242; H02J 13/00002; H05B 47/19; Y02E 40/70; Y02E 60/00; Y04S 10/22
See application file for complete search history.

(56) References Cited

U.S. PATENT DOCUMENTS

| | | | |
|---|---|---|---|
| 4,256,972 A | | 3/1981 | Wyatt et al. |
| 4,310,771 A | | 1/1982 | Wyatt et al. |
| 4,380,146 A | | 4/1983 | Yannone et al. |
| 4,804,938 A | | 2/1989 | Rouse et al. |
| 4,931,725 A | * | 6/1990 | Hutt ..................... G01R 21/133 324/130 |
| 6,327,541 B1 | | 12/2001 | Pitchford et al. |
| 6,483,825 B2 | | 11/2002 | Seta |
| 6,496,342 B1 | | 12/2002 | Horvath et al. |
| 6,650,249 B2 | | 11/2003 | Meyer et al. |
| 6,654,216 B2 | | 11/2003 | Horvath et al. |
| 6,751,562 B1 | | 6/2004 | Blackett et al. |
| 6,798,190 B2 | | 9/2004 | Harding et al. |
| 6,847,297 B2 | | 1/2005 | Lavoie et al. |
| 6,892,115 B2 | | 5/2005 | Berkcan et al. |
| 7,406,354 B2 | | 7/2008 | Pearce et al. |
| 7,453,674 B2 | | 11/2008 | Kuehnle et al. |
| 7,698,582 B2 | | 4/2010 | Qin et al. |
| 7,877,169 B2 | | 1/2011 | Slota et al. |
| 7,923,853 B2 | | 4/2011 | Lewis |
| 8,407,016 B2 | | 3/2013 | Slota et al. |
| 8,761,948 B1 | | 6/2014 | Ippolito et al. |
| 9,136,711 B2 | | 9/2015 | Slota et al. |
| 9,720,395 B2 | | 8/2017 | Shi et al. |
| 9,989,034 B2 | | 6/2018 | Andresen et al. |
| 10,237,008 B2 | | 3/2019 | Butterworth et al. |
| 2004/0025496 A1 | | 2/2004 | Patterson |
| 2004/0123174 A1 | | 6/2004 | Dhupar et al. |
| 2004/0264478 A1 | | 12/2004 | Valk et al. |
| 2005/0273281 A1 | * | 12/2005 | Wall ..................... G06Q 50/06 702/60 |
| 2006/0235574 A1 | | 10/2006 | Apinski et al. |
| 2006/0247874 A1 | * | 11/2006 | Premerlani ........ G01R 19/2513 702/64 |
| 2007/0010898 A1 | | 1/2007 | Hosek et al. |
| 2008/0157538 A1 | | 7/2008 | Lewis |
| 2008/0238406 A1 | * | 10/2008 | Banhegyesi ........ G01R 21/1331 324/120 |
| 2008/0279321 A1 | | 11/2008 | Bickel et al. |
| 2009/0096211 A1 | | 4/2009 | Stiesdal |
| 2009/0228224 A1 | * | 9/2009 | Spanier .................. G01R 19/00 702/188 |
| 2010/0111112 A1 | | 5/2010 | Bickel |
| 2010/0134089 A1 | | 6/2010 | Uram et al. |
| 2011/0118855 A1 | | 5/2011 | Hosek et al. |
| 2012/0020119 A1 | * | 1/2012 | Tang ..................... H02M 1/425 363/21.02 |
| 2013/0073100 A1 | | 3/2013 | Seeley |
| 2015/0311903 A1 | | 10/2015 | Frampton |
| 2016/0285286 A1 | | 9/2016 | Kudo et al. |
| 2016/0347179 A1 | | 12/2016 | Bachmaier et al. |
| 2018/0062394 A1 | | 3/2018 | Veda et al. |
| 2019/0027939 A1 | | 1/2019 | Kleen et al. |

OTHER PUBLICATIONS

Beckwith Electric Co. Inc.; "Application Guide M-0193B Syncrocloser Unit"; Copyright 1999 Beckwith Electric Co.; Document # 800-0193B-AG-MC2; 25 pages.

BiTronics PowerPlex—Digital Power Transducer; Copyright Areva 2005; Doc. # Automation-L3-PPLEX-BR-10.05-1208-GB; 8 pages.

Bitronics, Inc.; "Applicatins in the Field . . . Sync-check Application", available at www.bitronics.com on Aug. 1, 2007; 1 page.

Bitronics, Inc.; "Applications in the Field . . . Auto-synchronizing", available at www.bitronics.com on Aug. 1, 2007; 2 pages.

\* cited by examiner

Synchrophasor Representation

ZC, PEAK and REPORT time example

SP$_{DI}$ Update Flow

Individual Synchrophasor computuation Flowchaft

| Generic frame format | | | | | | |
|---|---|---|---|---|---|---|
| Common field | | | | | DATA | Common field |
| SYNC | FRAMESIZE | IDCODE | SOC | FRACSEC | | CHK |

PMU Generic Frame Format

FIG. 7

| Header frame format | | |
|---|---|---|
| Common field | DATA "PMU" | CHK |

PMU Header Frame Format

FIG. 8A

| Data frame format | | | | | | | | | | | | | | | | | | | | | |
|---|---|---|---|---|---|---|---|---|---|---|---|---|---|---|---|---|---|---|---|---|---|
| Common field | STAT | DATA | | | | | | | | | | | | | | | | | | | CHK |
| | | PHASORS | | | | | | | | | | FREQ | ROCOF | | | | | | | | |
| | | $X_{VA}$ | $X_{VB}$ | $X_{VC}$ | $X_{IA}$ | $X_{IB}$ | $X_{IC}$ | $X_{V1}$ | $X_{V2}$ | $X_{I1}$ | $X_{I2}$ | | | | | | | | | | |
| | | ANALOGUE | | | | | | | | | | | | | | | | | | DIGITAL | |
| | | Watt | | | | VAR | | | | VA | | | | PF | | | | | | | |
| | | Total | A | B | C | Total | A | B | C | Total | A | B | C | Total | A | B | C | | | | |

Data Frame format with all possible reported data

FIG. 8B

| Configuration frame format | | | | | | | | | | | | | | | |
|---|---|---|---|---|---|---|---|---|---|---|---|---|---|---|---|
| Common field | DATA | | | | | | | | | | | | | | CHK |
| | TIME_BASE | NUM_PMU | STN | ID_CODE | FORMAT | PHNMR | ANNMR | DGNMR | CHNAM | PHUNIT | ANUNIT | DIGUNIT | FNOM | CFGCNT | DATA_RATE | |

PMU Configuration Frame Format

FIG. 9

PMU Command Frame Format

Current screen in device profile editer in PMU software

Settings block update procedure flowchart

Current online screen in the PMU software

FIG. 13

Where: $t_1$ = TOD SYNC message sent by MASTER
$t_2$ = TOD SYNC message received by SLAVE
$t_3$ = TOD DELAY REQ request sent by SLAVE
$t_4$ = TOD DELAY RESP request by received MASTER Message Summary Setup PHY Clock Best Master Clock (BMC) Flow Chart PTP Time Snychronization Circuitry PTP Time Synchronization Flow Chart

PHASOR MEASUREMENT UNITS, SYNCHROPHASOR SYSTEMS AND METHODS THEREOF

PRIORITY

This application claims priority to U.S. Provisional Patent Application Ser. No. 63/390,310, filed Jul. 19, 2022, the contents of which are hereby incorporated by reference in its entirety.

This application is also a continuation-in-part application to U.S. patent application Ser. No. 16/888,975, filed Jun. 1, 2020, which is a continuation application of U.S. patent application Ser. No. 14/851,661, filed Sep. 11, 2015, now U.S. Pat. No. 10,671,106, which is a continuation application of U.S. patent application Ser. No. 13/439,333, filed Apr. 4, 2012, now U.S. Pat. No. 9,136,711, the contents of all of which are hereby incorporated by reference in their entireties.

BACKGROUND

Field. The present disclosure relates generally to intelligent electronic devices (IEDs) and utility metering systems, and more particularly, to phasor measurement units (PMUs), synchrophasor systems and methods thereof.

Description of the Related Art. The synchronized phasor measurement in substations was first standardized in 1995 in the IEEE 1344 standard. This standard was improved upon over the years and in 2012 IEC 61850-90-5 was published. IEC 61850-90-5 presented a way to migrate earlier synchrophasor standards to the IEC 61850 architecture, in order to take advantage of faster sampling and data transmission rates, as well as improved Cyber security.

However, the idea behind synchrophasors arose in the 1970s, when the use of computers to implement protection and control functions was in the early stages of its development. The perceived need was the development of a measurement of the fundamental quantities of voltage and current. Then protection and control algorithms could be based on that measurement.

The first step toward synchrophasors was when Dr. Arun Phadke of American Electric Power proposed using a discrete Fourier transform (DFT) function to compute a "phasor" view of voltage and current.1 When this calculation was implemented in a minicomputer, it was noted that the "phasor" computed by the DFT would rotate over time. The possibility of synchrophasors developed with the realization that the phasor measurement could be synchronized to absolute time throughout the power grid, giving a wide-area view of the actual conditions throughout it. Though this inspired idea took place in 1979, it took roughly eight years before the necessary high-accuracy time synchronization technology would arrive, in the form of GPS. It was then possible to measure the phasors across the grid at a synchronized time. That is when synchrophasors became an invaluable tool for electrical grid analysis.

SUMMARY

The present disclosure provides for phasor measurement units (PMUs), synchrophasor systems and methods thereof.

A phasor measurement unit (PMU) of the present disclosure measures phasor, i.e., magnitude and phase angle of voltage and current, and related data from a specific location on the electrical gird synchronized to a common time source. The time-synchronized phasor is called a synchrophasor. In a system of the present disclosure, a plurality of PMUs transmit the synchrophasors and related data to a phasor data concentrator (PDC), which aggregates and time-aligns the data for real time and post analysis. The PMU of the present disclosure further functions as a power quality meter.

According to one aspect of the present disclosure, a device is provided including a voltage input sensor circuit operative to sense line voltage from the AC power system and generate at least one voltage signal representative of the line voltage sensed from the AC power system; a current input sensor circuit operative to sense line current from the AC power system and generate at least one current signal representative of the line current sensed from the AC power system; a plurality of analog-to-digital converter circuits configured to sample the at least one voltage signal and the at least one current signal to output digital samples representative of the at least one voltage signal and the at least one current signal; at least one processor operatively coupled to the plurality of analog-to-digital converter circuits and configured to perform at least one mathematical computation on the digital samples received from the analog-to-digital converter circuits, at least one mathematical computation including determining a magnitude and phase angle of each of the at least one voltage signal and the at least one current signal; and a clock for time-stamping the determined magnitude and phase angle, the clock being time synchronized with an external time source.

In one aspect, the external source is at least one of an IRIG-B source and/or a PTP source.

In another aspect, the device further includes a communication device that transmits the time-stamped magnitude and phase angle over a network.

In a further aspect, the communication device operates under User Datagram Protocol (UDP).

In yet another aspect, the communication device transmits the time-stamped magnitude and phase angle in at least one of a multicast mode, broadcast mode and/or a unicast mode.

In a further aspect, the communication device supports two simultaneous sessions with external client devices.

In one aspect, the at least one mathematical computation further includes determining at least one of symmetrical components' phasor, frequency, rate of change of frequency, high-speed digital inputs, analog fundamental power and/or displacement power factor.

In another aspect, the at least one mathematical computation further includes determining at least one power quality event.

In a further aspect, the power quality event includes at least one of a voltage sag, a voltage swell and/or a voltage transient.

According to another aspect of the present disclosure, a device is provided including at least one sensor for sensing at least one input voltage and current channel of an electrical distribution system, at least one input channel for receiving AC voltages and currents from the at least one sensor including at least one analog to digital converter for outputting digitized signals; and a processing system including a field programmable gate array (FPGA) and a digital signal processor (DSP) coupled to the at least one input channel configured to receive the digitized signals, the FPGA configured to capture high speed inputs and synchronize the captured inputs with an external time source and the DSP is configured to determine a magnitude and phase angle of the captured inputs, the FPGA further configured to determine a power quality event from the sensed at least one input voltage and current channels.

BRIEF DESCRIPTION OF THE DRAWINGS

These and other objects, features and advantages of the present disclosure will be apparent from a consideration of the following Detailed Description considered in conjunction with the drawing Figures, in which:

FIG. 7 illustrates a PMU generic frame format according to an embodiment of the present disclosure.

FIG. 8A illustrates a PMU header frame format according to an embodiment of the present disclosure.

FIG. 8B illustrates a PMU header frame format with all possible reported data according to an embodiment of the present disclosure.

FIG. 9 illustrates a PMU configuration frame format according to an embodiment of the present disclosure.

FIG. 13 illustrates another screen shot of a PMU software application according to an embodiment of the present disclosure.

DETAILED DESCRIPTION

Figure 1:
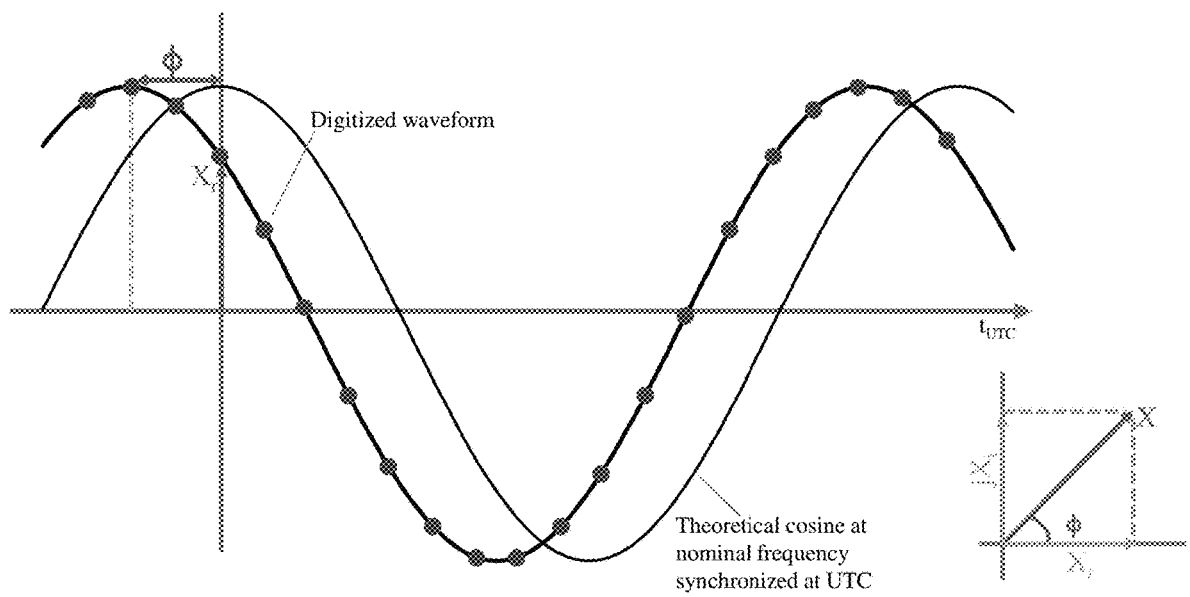
FIG. 1 illustrates a synchrophasor representation according to an embodiment of the present disclosure.

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

1. Definition, Acronyms and Abbreviation

ADC: Analogue to Digital Converter
CT: Current Transformer
DFT: Discrete Fourier Transform
DI: Digital Input
DSP: Digital Signal Processing
FPGA: Field Programmable Gate Array
FPS: Frames Per Second
IP: Internet Protocol
IRIG-B: Inter-Range Instrumentation Group—Time code format B PDC: Phasor Data Concentrator
PF: Power Factor
PMU: Phasor Measurement Unit
PPS: Pulse Per Second
FTP: Precision Time Protocol—IEEE 1588-2008
RMS: Root Mean Square
ROCOF: Rate Of Change Of Frequency
SOC: Seconds Of Century
UTC: Universal Time Coordinated
WG: Working Group
TCP: Transmission Control Protocol
UDP: User Datagram Protocol
ZC: Zero Crossing
Comm: Communication
Client: User interfacing the PMU via a PDC software
Ether: Ethernet
Freq: Frequency
$f_s$: Sample Rate (61440 Hz)
$I_k$: Current phase K, where K will be either A, B, or C
sec: Seconds
sync: Synchronization
User: User interfacing the PMU via a CommunicatorPQA software symmetrical component
$V_0/I_0$: Zero voltage/current symmetrical component
$V_1/I_1$: Positive voltage/current symmetrical component
$V_2/I_2$: Negative voltage/current symmetrical component
$V_k$: Voltage phase K to neutral, where K will be either A, B, or C
$X_I$: Synchrophasor of the Current
$X_V$: Synchrophasor of the Voltage
$X_m$: Waveform's peak
$X_{rms}$: Synchrophasor's magnitude
φ: Synchrophasor's phase
Primary voltage: The primary voltage input channel is $V_A$. If $V_A$ is zero (or no input) then primary voltage input channel is $V_B$. If the $V_B$ is zero (or no input) then the primary voltage input channel is $V_C$. If $V_C$ is zero (or no input) then the primary voltage is zero

2. Overview

The commonly voltage/current waveform representation is a Phasor (X). A Phasor equation in different presentation is shown below, where $X_m$ is the waveform peak, $X_{rms}$ is the RMS of the waveform, the subscripts r and i are for real and imaginary parts, respectively, in complex rectangular presentation, φ is the phase angle of the waveform which depended on a certain referent and ω is the angular frequency.

$$x(t) = X_m \cos(\omega t + \varphi), \text{ waveform representation} \quad (1)$$

$$X = \frac{X_m}{\sqrt{2}} e^{j\varphi} = X_{rms} e^{j\varphi}, \text{ phasor in complex polar presentation} \quad (2)$$

$$X = X_{rms}(\cos\varphi + j\sin\varphi) = X_r + jX_i, \quad (3)$$

phasor in complex rectangular presentation

The synchrophasor definition will be X obtained by a digitized voltage or current waveform and the phase angle is relative to positive peak of a theoretical cosine signal, at the nominal system frequency, precisely synchronized to common time base UTC, a representation of which is shown in FIG. 1.

3. Operation

3.1. Overview

An overview of the PMU capabilities of the devices and systems of the present disclosure is listed in Table 1.

TABLE 1

| PMU capabilities | |
|---|---|
| Parameter | PMU |
| Metering Protocol | C37 118.1 2011/C37.118.1a 2014 [1] |
| Class | P/M |
| Rated frequency | 50 Hz/60 Hz |
| Rated voltage | 120/240 V |
| Rated current | 2 A/20 A |
| Individual voltage Phasor | $X_{VA}, X_{VB}, X_{VC}$ |
| Symmetrical component voltage Phasor | $X_{V0}, X_{V1}, X_{V2}$ |
| Individual current Phasor | $X_{IA}, X_{IB}, X_{IC}$ |
| Symmetrical component current Phasor | $X_{I0}, X_{I1}, X_{I2}$ |
| Frequency | Yes |
| ROCOF | Yes |
| Analogue | Fundamental Power |
| Digital Input | 8 inputs of the Built-in high-speed Digital Input |
| Report rate | 10; 12; 15; 20; 30; 60 (at 60 Hz nominal frequency) 10; 25; 50 (at 50 Hz nominal frequency) |
| Time synchronization | IRIG-B IEEE 1588 (PTP) With time quality: leap second and time traceable |
| Comm Hardware | Ether 10/100 (Copper), 100 (Fiber) |
| Comm Protocol | C37.118.2 2011 UDP (multicast/broadcast/unicast) for data TCP for command, configuration, and header |
| Comm Number of Session | 2 |
| Comm Settings | Configurable |
| Data format | Configurable |

The data reported by the PMU, also known as synchrophasor data, may contain synchrophasor, frequency, ROCOF, digital input and analogue data. The detailed list of the synchrophasor data is shown in Table 2. A user may configure the PMU to report all data listed in Table 2 or part of them but at least the individual synchrophasor voltage/current, frequency and ROCOF should be always reported to comply to standard requirements. The synchrophasor data is sent out at a configured report rate, and the data are embedded into the data frame packet.

TABLE 2

| synchrophasor data | |
|---|---|
| Data | Details |
| $X_{VA}, V_{VB}, X_{VC}$ | Individual synchrophasor voltage |
| $X_{IA}, X_{IB}, X_{IC}$ | Individual synchrophasor current |
| $X_{V0}, X_{V1}, X_{V2}$ | Symmetrical component synchrophasor voltage |
| $X_{I0}, X_{I1}, X_{IC}$ | Symmetrical component synchrophasor current |
| Digital Input | High speed built-in digital input |
| Analogue | Fundamental power Watts: Total and per phase (A, B, C) VAR: Total and per phase (A, B, C) VA: Total and per phase (A, B, C) PF: Total and per phase (A, B, C) |
| Frequency | System frequency |
| ROCOF | |

3.2. Metering

Figure 2:
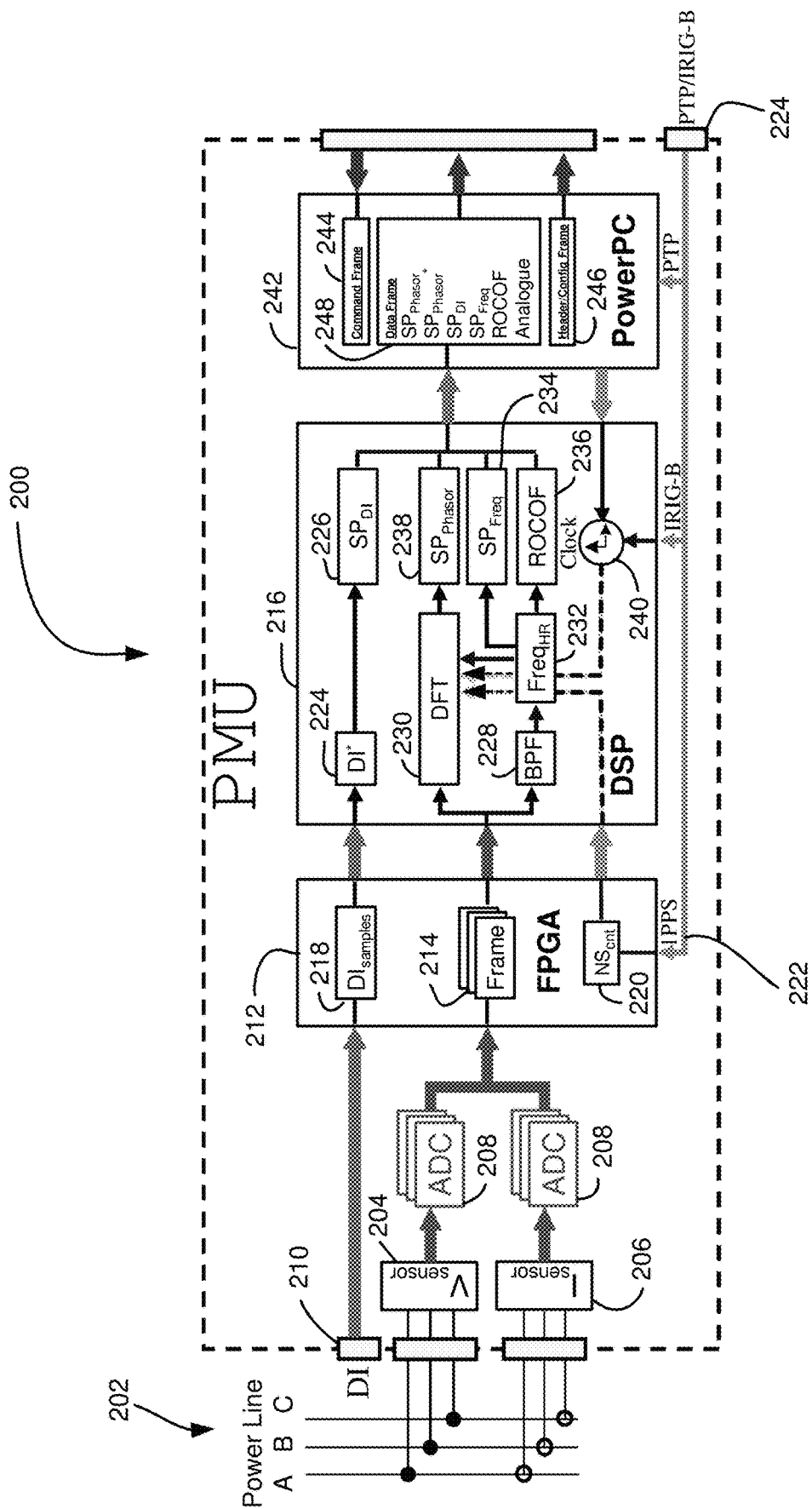
FIG. 2 is a block diagram of a phasor measurement unit (PMU) according to an embodiment of the present disclosure.

The block diagram of the PMU 200 is shown in FIG. 2. Each of the components of PMU 200 will now be described.

A, B, C 202: Power line A, B, C, 202 are the inputs, aka called channels: voltage phase to neutral ($V_A$, $V_B$ and $V_C$) and phase currents ($I_A$, $I_B$ and $I_C$) input.

$V_{sensor}$ 204: The voltage sensors 204 are formed by, for example, resistive dividers, which reduce the voltage to obtain values compatible with ADC.

$I_{sensor}$ 206: The current sensors 206 are formed by, for example, a CT followed by a current-to-voltage resistive converter (IxV). The IxV converts the CT secondary current to voltage values, which will be amplified to obtain values compatible with the input limits of the ADC.

ADC 208: 8 bits Analogue-to-Digital converter 208. The ADCs 208 digitizes the channels at 61440 samples per second ($f_s$), which means one sample every about 16.27 µsec DI 210: 8 inputs of the high-speed built-in digital input (DI) 210.

Figure 3:
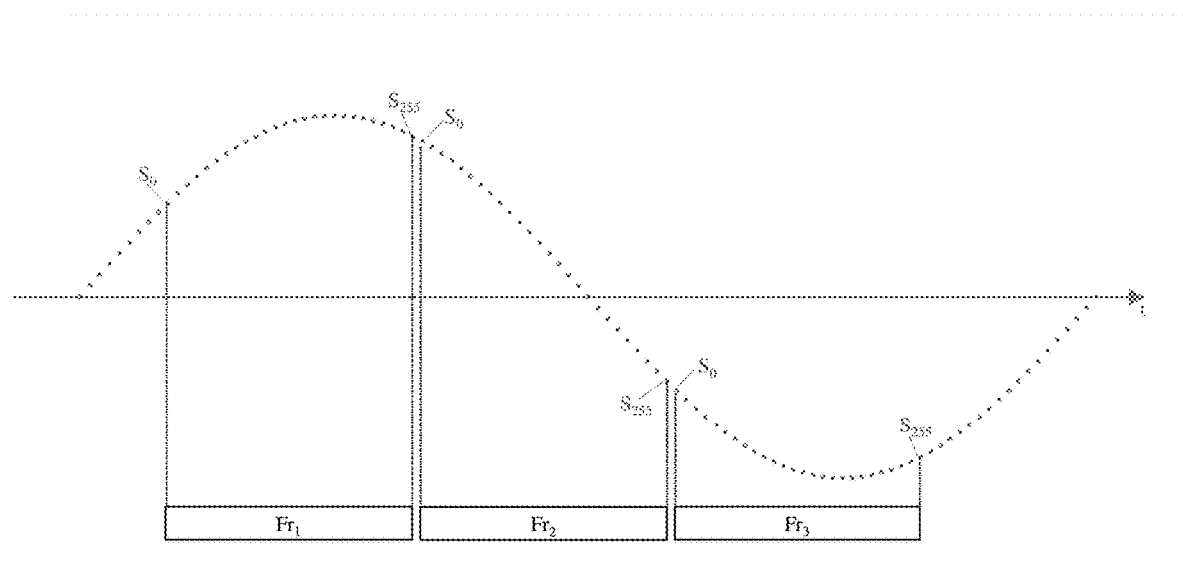
FIG. 3 illustrates frames of digital samples according to an embodiment of the present disclosure.

FPGA 212:

Frame 214: The FPGA 212 collects a group of 256 samples, aka called frame (Fr), from the ADC 208 for each channel. The samples inside a frame could be numbered from 0 ($S_0$) to 255 ($S_{255}$), as shown in FIG. 3. The FPGA 212 interrupts the DSP 216 every 4.16 msec (frame update rate²) to transfer the frames to DSP 216.

$DI_{samples}$ 218: The FPGA 212 collects a group of 256 samples of the DI 210. Those samples 218 are sent to DSP 216 together with the frames 214.

$NS_{cnt}$ 220: The FPGA 212 monitors a PPS 222 synchronized at the second mark. That PPS 222 is provided by the time source¹: IRIG-B or PTP 224. The FPGA 212 contains a nano second counter (NScnt) 220, which is incremented by one every about 10.047 nsec (period of nano second clock). This NScnt 220 is cleared at 4.16 msec frame update rate. The FPGA 212 will latch the current value of NScnt (A) when a PPS 222 occurs, given a precise elapsed time in nano seconds resolution (A*10.047 nsec) to the DSP 216 where the PPS 222 happens inside a frame every second.

Figure 4:
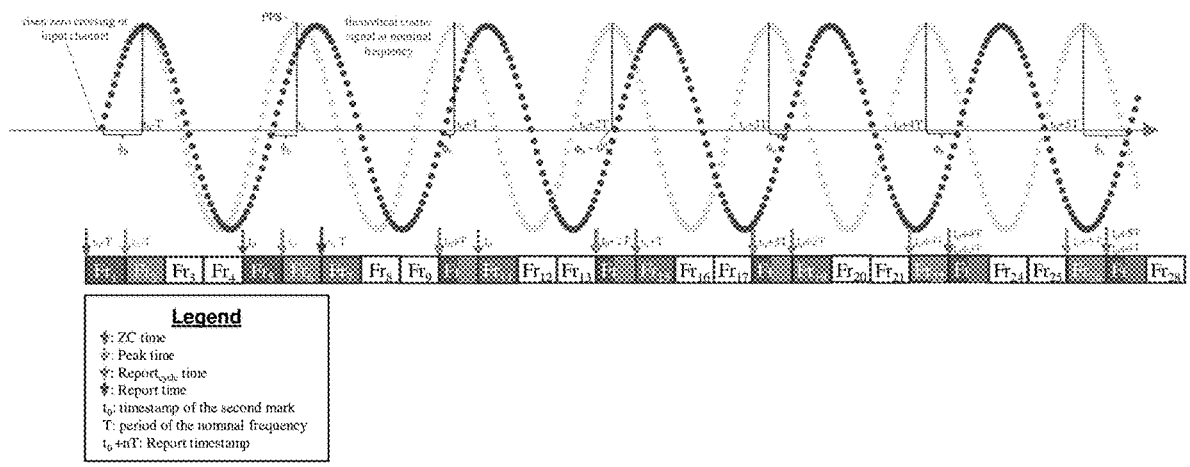
FIG. 4 illustrates various frames and report time of a waveform according to an embodiment of the present disclosure.

The monitoring and report times of the FPGA 212 will be explained in conjunction with FIG. 4. In FIG. 4, it is to be appreciated that the report rate configured by the user is twice slow than the cycle base on the nominal frequency. It is further to be appreciated that the PMU will be able to send out data if the PMU is configured to synchronize time with via a IRIG-B or PTP time source. The following data points or variables are used in conjunction with the description of FIG. 4:

(1) Frame update time: In DSP 216, this is the moment when FPGA 212 interrupts the DSP 216 to send a new frame, and this happens every 4.16 msec.

(2) ZC time: In DSP 216, this is the moment when a risen zero crossing of the system frequency is detected within a frame. This happens at cycle base on the system frequency. This time could be a moment to update the individual synchrophasor via DFT The ZC Index is a relative index pointing to the sample number where the ZC happens within the frame.

(3) PEAK time: In DSP 216, it is the moment when a "positive peak of a theoretical cosine signal at nominal frequency synchronized at UTC time happens within a frame. This happens at cycle base on the nominal frequency. The PEAK Index is a relative index pointing to the sample number where the peak happens within the frame (4) $REPORT_{cycle}$ time: In DSP 216, it is a moment where all synchrophasor data gets update at cycle base on the nominal frequency.

This moment happens 6 frame updates later than the peak time. This time could be a moment to update the individual synchrophasor via DFT 230.

(5) REPORT time: This is a snapshot of the synchrophasor data update at $Report_{cycle}$ time but happening at user configured rate.

(6) REPORT timestamp: This is the timestamp when the individual synchrophasor is computed

DSP 216:

DI* 224: The DSP 216 will receive from FPGA 212 samples update of all 8 high speed digital inputs ($DI_{samples}$) every frame update time and will generate a state and transition for each input (DI*) based on those samples. A transition is set to 1 when the digital input changes its state, otherwise it keeps to 0.

Figure 5:
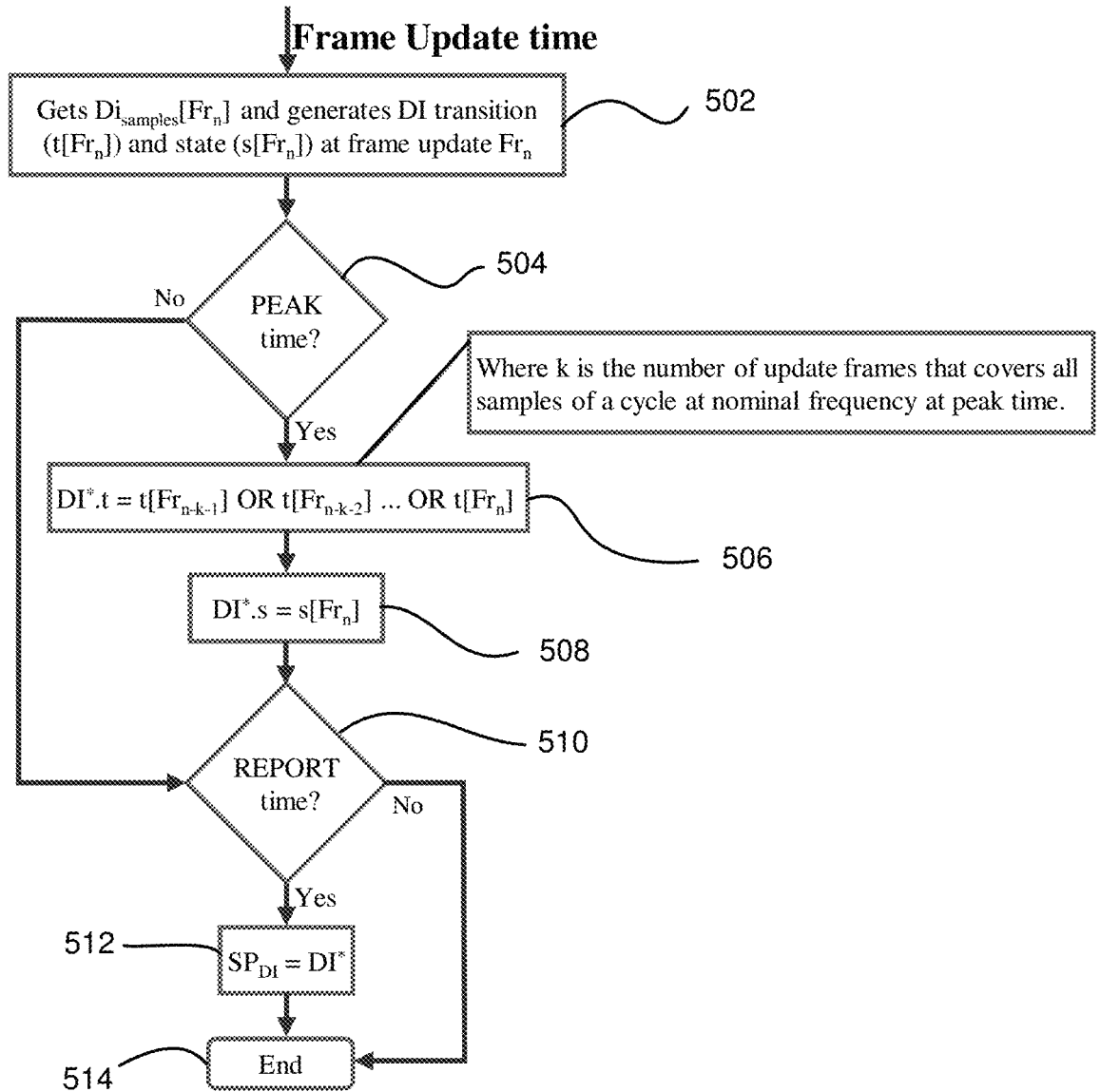
FIG. 5 is a flow chart illustrating a method for updating state and transition of each digital input (SPD) according to an embodiment of the present disclosure.

$SP_{DI}$ 226: This is one of the synchrophasor data computed by DSP 216. This is the state and transition of each digital input update at REPORT time. The state and transition are the evaluation of DI* every PEAK time. The state value is the one generated in the last frame of the cycle at nominal frequency. The transition value is OR logic of all transition value computed in every frame update within that cycle. FIG. 5 illustrates a method to update the $SP_{DI}$.

BPF 228: Band-pass filter.

$Freq_{HR}$ 232: High-Resolution frequency.

$SP_{Freq}$ 234: This is one of the synchrophasor data computed by DSP. Details about the frequency computation will be described below.

Primary voltage zero makes the $SP_{Freq}$ to zero

ROCOF 236: This is one of the synchrophasor data computed by DSP. This is evaluated every REPORT time. Its formula is shown below where T is the period of nominal frequency.

$$ROCOF = \frac{\Delta_{SPFreq}}{T}$$

Primary voltage zero makes the ROCOF to zero

During transitory, the ROCOF value will the average following the formula below $$ROCOF = \sum_{i=0}^{3} \frac{\Delta_{SPFreq_i}}{T}$$

DFT 230: The DFT 230 is evaluated every either ZC time or $REPORT_{cycle}$ time and computes the individual synchrophasor providing a magnitude ($X_{rms}$) and phase ($\phi$) of the phasor. The details about parameters for DFT computation can be found in Table 9. The flow to compute the individual synchrophasor are shown in the FIG. 6.

$SP_{Phasor}$ 238: This is one of the synchrophasor data computed by DSP, the individual synchrophasor, and it is update at REPORT time. It is to be appreciated that primary voltage zero makes $SP_{Phasor}$ zero, magnitude and phase equal to zero.

Clock 240: This is the PMU clock and it used to timestamp the synchrophasor data when update. This clock is accurate synchronized with external time source: either IRIG-B or FTP. The FTP operation is described below.

PowerPC 242:

It is the outside communication interface to FTP and PMU packet traffic.

Command Frame 244: It receives the PMU command frame incoming packet, interpret it, and responds accordingly.

Header/Config frame 246: It sends header/configuration frame outgoing packet as a response to header/config frame command.

Data frame 248: The PowerPC 242 receives some of the synchrophasor data update: individual phasor ($SP_{Phasor}$) 238, digital input ($SP_{DI}$) 226, frequency ($SP_{Freq}$) 234 and ROCOF 236, at REPORT time from DSP 216. The PowerPC 242 computes the symmetrical components phasor ($SP_{Phasor*}$) and Analogue using the individual synchrophasor as input. Those computation are performed when receives an update from DSP at REPORT time. The analogue data computed based on the individual synchrophasor are: fundamental Watt total and per phase, fundamental VAR total and per phase, fundamental VA total and per phase and fundamental PF total and per phase, the details of the computation of same will be described below. The PowerPC will combine all data to build the data frame and then send the data frame out at REPORT time.

FIG. 5 illustrates a method to update the $SP_{DI}$. In step 502, the DSP 216 gets $DI_{samples}$ for the nth frame [$Fr_n$] and generates DI transition 9t[$Fr_n$] and state (s[$Fr_n$]) at frame update $Fr_n$. In step 504, the DSP 216 determines if PEAK time has occurred. If PEAK time has occurred, the Digital Input transition value (DI·t) is computed as an OR logic of all previous transition value, in step 506, which it is evaluated in every frame update within that cycle, and the digital input state value (DI·s) is the state at the last frame of that cycle, step 508. For example, if the cycle contains 4 frames updates and within this cycle the Digital input changed from 0 to 1 but bounces 3 times:

_ _1
0_| |_| transition=0 OR 1 OR 1 OR 1=1 (does exit transition within cycle)
state=1 (the state in the last frame)

In another example, if the cycle contain 4 frames updates and within this cycle the Digital input changed from 0 to 1 but bounces 1 time:

_____1
0_| transition=0 OR 1 OR 0 OR 0=1 (does exit transition within cycle)
state=1 (the state in the last frame)

In step 510, the DSP 216 determines if REPORT time has occurred. If REPORT time has occurred, then the last digital input transition and state computed at PEAK time is reported along with other synchrophasor data, in step 512. In step 514, the process ends.

Figure 6:
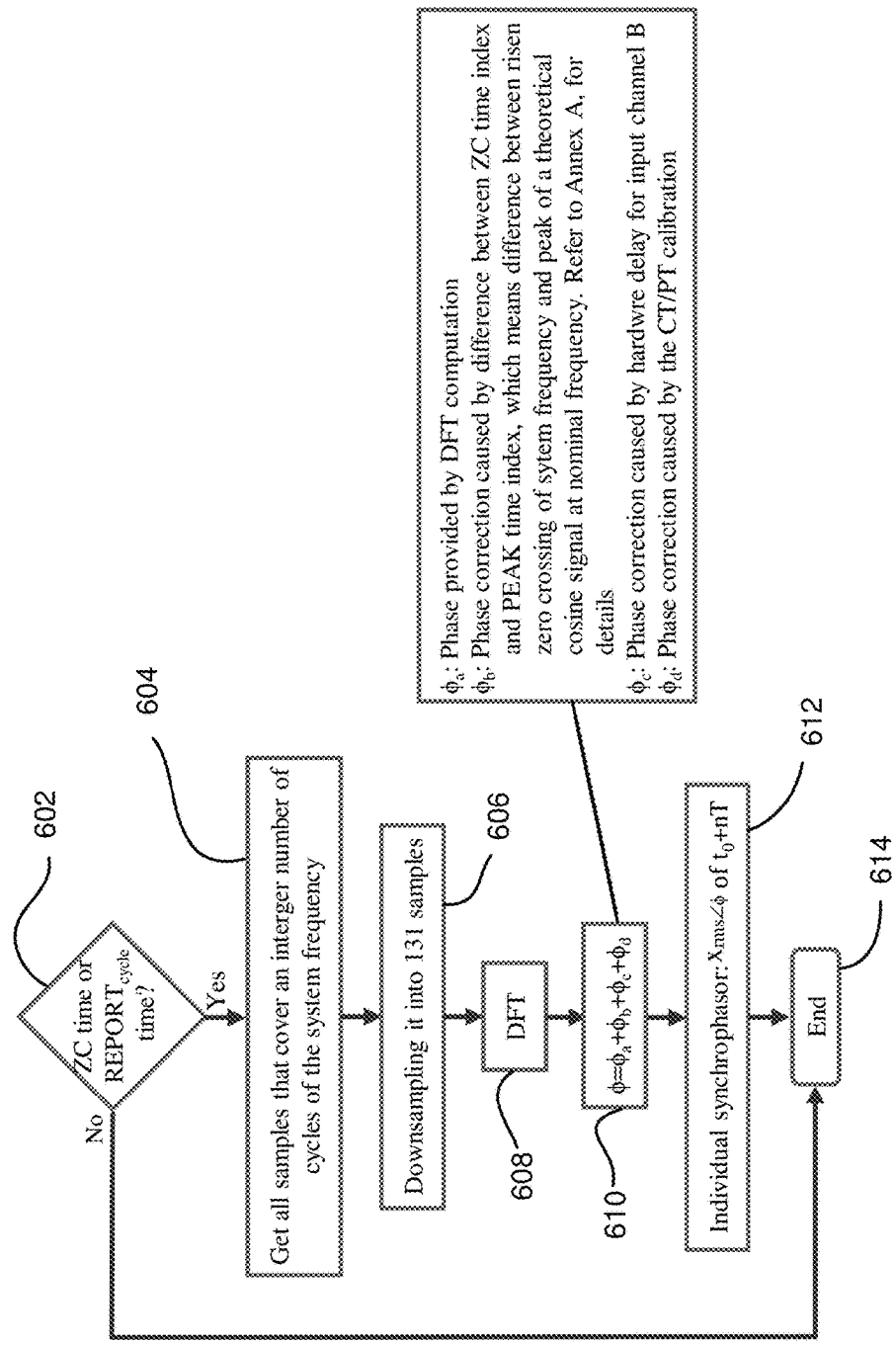
FIG. 6 is a flow chart illustrating a method for computing an individual synchrophasor according to an embodiment of the present disclosure.

The flow to compute the individual synchrophasors is shown in the FIG. 6. In step 602, the DSP 216 determines if the $ZC_{time}$ or $Report_{cycle}$ has occurred. If the answer in step 602 is in the affirmative, the DSP 216 gets or retrieves all the samples that cover an integer number of cycles of the system frequency, in step 604. In step 606, the DSP 216 downsamples the retrieved samples into 131 samples. In step 608, a DFT 230 (Discrete Fourier Transform) is applied to the 131 samples to generate the magnitude ($X_{rms}$) and phase ($\phi a$) of the phasor.

Next, in step 610, an adjusted phase is generated ($\phi$) as a correction applied over the phase ($\phi a$) provided by DFT caused by 1) differences between ZC time index and PEAK time index, which means difference between risen zero crossing of system frequency and peak of a theoretical cosine signal at nominal frequency, 2) hardware delay (but only for input channel B) and 3.) CT/PT calibration. In step 612, the individual phasor is provided as complex polar form by the following formula:

$$x_{rms \angle \phi} \text{ of } t_0 + nT$$

where $X_{rms}$, magnitude of the phasor
 $\phi$, phase of the phasor
 $t_0$=timestamp of second mark
 n=an integer number
 T=period of nominal frequency Lastly, the method ends in step 614.

3.3. Communication

The PMU communications follow the IEEE C37.188.2-2011 standard and it is over Ethernet media. The user may configure the PMU communication in meter's device profile The four-frame type allowed in the PMU are: header, configuration, data, and command frames. Within a frame, there are fields that are common for all frame type and field (data) that it is specific to each frame type. FIG. 7 shows a generic frame format. The Table 3 shows details about the fields in generic frame format. The values for the fields are standard values.

TABLE 3

Common fields detail in PMU generic frame format
Generic Frame format: common fields details

| Name | Value | Description |
| --- | --- | --- |
| SYNC | AA01H | Data frame |
|  | AA11H | Header frame |
|  | AA21H | Configuration frame 1 |
|  | AA31H | Configuration frame 2 |
|  | AA41H | Command frame |
| FRAMESIZE | xxxxH | Depends on the frame type |
| IDCODE | 0001H (default) | It is configured by user |
| SOC | xxxxxxxxH | It gives the seconds of the frame timestamp from UTC midnight (00:00:00) of Jan. 1, 1970, to the current second |
| FRACSEC TQ | xyH | xxxxb: Both PTP/IRIG time synch, information about leap second provided by the time source |

TABLE 3-continued

Common fields detail in PMU generic frame format
Generic Frame format: common fields details

| Name | Value | Description |
|---|---|---|
| | | yyyyb: In PTP time sync 1111b: failure, not PTP time sync |
| | | yyyyb: clock accuracy |
| | | provided by PTP master inside ANNOUNCE PTP message |
| | | In IRIG-B time sync, 1111b: failure, not IRIG-B time sync |
| | | yyyyb, clock accuracy |
| | | provided by IRIG-B time source |
| FRACSEC | xxxxxxH | It gives the fractional seconds of the frame timestamp when dived by TIME_BASE |
| DATA | xx . . . xxH | The number of bytes and its meaning are frame related |
| CHK | xxH | This is the CRC-CCITT over all bytes above |

The frame timestamp is $SOC + \frac{FRACSEC}{TIME\_BASE}$

Header: It is an outgoing frame. The PMU send out this frame as a response of received request header command incoming frame. Both request and response frames are sent out through TCP protocol. FIG. 8A shows the header frame format. The values for data filed is PMU implementation specific and in our PMU, it is a fixed string: "PMU".

Configuration: It is an outgoing frame. The PMU send out this frame as a response of received request configuration command incoming frame. Both request and response frames are sent out through TCP protocol. The PMU supports only configuration frame 1 and 2. FIG. 9 shows the configuration frame format. The Table 4 shows details about the fields in configuration frame format. The values for data fields are PMU implementation specific.

TABLE 4

Data field details in PMU configuration frame format
Configuration frame format: data filed details

| Name | Value | Description |
|---|---|---|
| TIME_BASE | 000F4240H | Resolution of the fractional second of the frame timestamp |
| NUM_PMU | 0001H | The number of PMU |
| STN | xxxxxxxxxxxxxxxxxxxx xxxxxxxxxxxxH | Station name and it is configured by the user |
| IDCODE | 0001H (default) | Data source ID number and it is configured by user |
| FORMAT | 000FH (default) | Data format within the data frame |
| | | Bits 15-04: 0 = unused |
| | | Bits 03: 1 = Freq/ROCOF in float point |
| | | Bits 02: 1 = Analogue in float point |
| | | Bits 01:1 = Phasor in float point |
| | | Bits 00: 1 = Phasor in polar presentation |
| PHNMR | 0006H (default) | Number of phasors |
| | | 06: If the user configures to report only individual phasor or |
| | | 12: If the user configures to report both individual and symmetrical components phasors |
| ANNMR | 0000H (default) | Number of analogue values |
| | | 00: if the user configures for not report analogue value |
| | | 15: if the user configures to report analogue value |
| DGNMR | 0000H (default) | Number of digital statis words |
| | | 00: if the user configures for not report digital input status |
| | | 01: if the user configures to report digital input status |
| CHNAM | "VA Phasor" (default) | Phasor/Analogue/Digital Input names and it is configured by user |
| | "VB Phasor" (default) | |
| | "VC Phasor" (default) | |
| | "IA Phasor" (default) | |
| | "IB Phasor" (default) | |
| | "IC Phasor" (default) | |
| PHUNIT | 000186A0H (default) = 100000 | Conversion factor for phasor and it is configured by user, |
| | 000186A0H (default) = 100000 | |
| | 000186A0H (default) = 100000 | |
| | 000186A0H (default) = 100000 | |
| | 000186A0H (default) = 100000 | |
| | 000186A0H (default) = 100000 | |

TABLE 4-continued

Data field details in PMU configuration frame format
Configuration frame format: data filed details

| Name | Value | Description |
|---|---|---|
| ANUNIT | Not available (default) | Conversion factor for analogue. If user selects analogue data to be reported the default value is:<br>0041H: Indicates that the analogue values are fundamental power readings<br>0001H: Factor. 0001H it is the default value |
| DIGUNIT | Not available (default) | Mask word for digital status words. If user selects digital status to be reported the default value is: 00FFH |
| FNON | 0001H (default) | Nominal line frequency and it is configured by user<br>0000H: 50 Hz<br>0001H: 60 Hz |
| CFGCNT | 0000H(initialization) | Configuration change count is incremented each time a change is made in the PMU configuration |
| DATA_RATE | 000AH (default) = 10FPS | Crate of the phasor data transmissions and it is configured by user, |

Data: It is an outgoing packet and the PMU send out this frame over UDP. A data frame containing all reported data send out by the PMU is shown in FIG. 8B.

TABLE 5

STAT filed in PMU data frame format
Data frame format: STAT filed details

| Name | Bit (MSB first) | value | Description |
|---|---|---|---|
| STAT | 15-14 | 00b | Data error<br>00b: in normal operation<br>01b: when any firmware is unhealth<br>10b: in test mode |
|  | 13 | 1b | PMU sync<br>0b: when the PMU is either sync with PTP or IRIG-B<br>1b: no sync |
|  | 12 |  | NOT APPLICABLE |
|  | 11 | 0b | PMU trigger detected<br>0b: no trigger<br>1b: When any digital input is assigned to trigger waveform and a trigger happening |
|  | 10 | 0b | Configuration change<br>0b: no change<br>1b: It is set to 1 for 1 minute to advise configuration will change and clear to 0 when the change effected |
|  | 09 |  | NOT APPLICABLE |
|  | 08-06 |  | PMU Time quality<br>111b: when bit 13 above is set (estimated maximum time error bigger than 10 msec or time error unknown)<br>100b: when bit 13 above is clear (estimatedmaximum time error less than 100 psec) |
|  | 05-04 |  | Unlocked time<br>00b: when bit 13 above is either clear or set for less than 10 sec<br>01b: when bit 13 above is set for more than 10 sec but less than 100 sec<br>10b: when bit 13 above is set for more than 100 sec but less than or equal to 1000 sec<br>10b: when bit 13 above is set for more than 1000 sec |
|  | 03-00 | 0000b | Trigger reason<br>0000b: no trigger happened<br>0111b: trigger happened caused by digital input |

The user can configure if the data frame will be sent in unicast, broadcast or multicast mode. In all mode, the user can configure the PMU to start sending the data frame as soon as the PMU is online (runtime).

Multicast/Broadcast: In these modes, multiples clients can receive the data frame over UDP protocol but through a destination port programmed in the PMU. Up two clients can simultaneously send command frames to PMU over TCP. In multicast/broadcast mode, if once user starts/stops receiving data all user/clients will start/stop receiving data. For example, if user A sends a stop command to the PMU then all users will stop receiving data; and if user B sends a start command, then all users will start to receive data.

Unicast: In this mode, up to two clients can simultaneously receive the same data frame over UDP protocol. The user can configure the IP address and port of the clients that would receive data frame. Optionally, the client/user can start/stop data frame streaming that they are receiving. It is to be appreciated that in unicast mode up to two users can receive data independently of each other, which means that user A may start/stop to receive data with effecting the starting/stopping of data received by user B.

Figure 10:
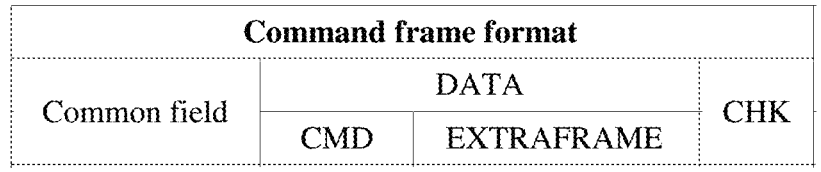
FIG. 10 illustrates a PMU command frame format according to an embodiment of the present disclosure.

Command: It is an incoming frame, and it is received through TCP protocol. FIG. 10 shows the command frame format.

The list of commands (CMD) supported by the PMU is listed below.

Disable Data Frame Streaming.
Enable Data Frame Streaming.
Request Header Info.
Request Config 1 Info.
Request Config 2 Info.

4. Settings 4.1. Device Profile

Figure 11:
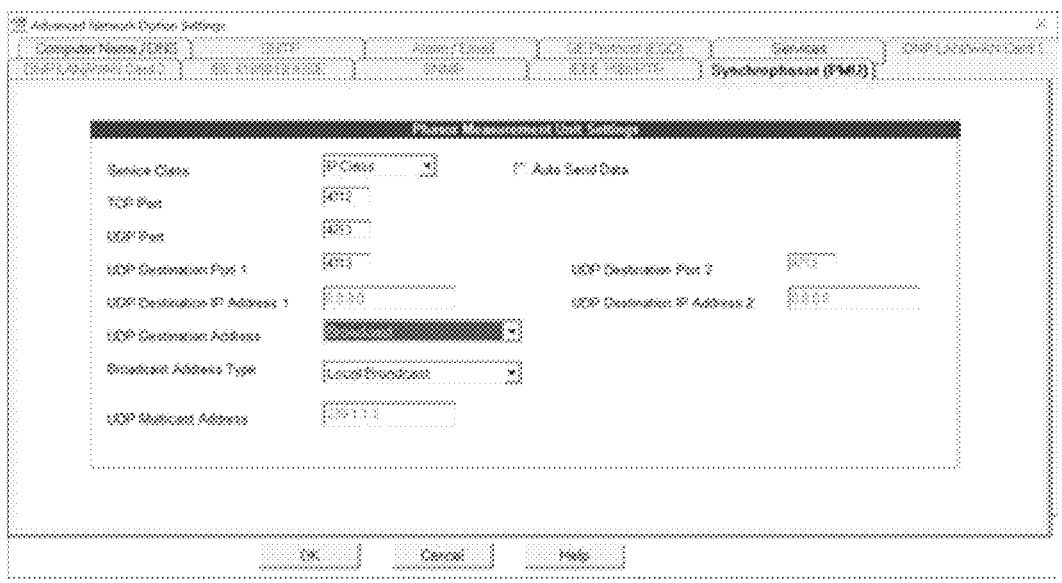
FIG. 11 illustrates a screen shot of a device profile editor in a PMU software application according to an embodiment of the present disclosure.

There are some of PMU settings that are programmable in device profile editor in the PMU software, as shown in FIG. 11.

The settings in device profile are mainly for PMU communication settings. The Table below shows all PMU connection configurations available in Device Profile.

TABLE 6

PMU communication settings in device profile settings
Settings

| Name | Description |
|---|---|
| Enable/Disable | Enable/Disable this feature. Refer to [12] Default: Disable Modbus Holding Register B3BCH (MSB first, bit $08^{th}$) |
| TCP port | PMU TCP listening port 2 bytes unsigned integer Default: 4712 Modbus Holding Register 7A00H Note: (1) This must always be available |
| UDP port | PMU UDP listening port 2 bytes unsigned integer Default: 4713 Modbus Holding Register 7A01H Note: (1) This must always be available. |
| UDP destination port 01 | UDP destination listening port 01 2 bytes unsigned integer Default: 4713 Modbus Holding Register 7AO2H Note: (1) This must always be available. |
| UDP destination IP Address 01 | UDP destination listening IP address 01 4 bytes unsigned integer Default: 0.0.0.0 Modbus Holding Register 7A08H Note: (1) This must be available only when UDP destination address type set in "Bit mask" bellow is "unicast". |
| UDP destination port 02 | UDP destination listening port 02 2 bytes unsigned integer Default: 4713 Modbus Holding Register 7A03H |

TABLE 6-continued

PMU communication settings in device profile settings
Settings

| Name | Description |
|---|---|
| | Note: (1) This must be available only when UDP destination address type set in "Bit mask" bellow is "unicast". |
| UDP destination IP Address 02 | UDP destination listening IP address 02 4 bytes unsigned integer Default: 0.0.0.0 Modbus Holding Register 7A0AH Note: (1) This must be available only when UDP destination address type set in "Bit mask" bellow is "unicast". |
| UDP multicast address | UDP multicast address 4 bytes unsigned integer Default: 239.1.1.2 Modbus Holding Register 7A04H-7A05H Note: (1) This must be available only when UDP destination address type set in "Bit mask" below is "multicast". (2) This input must be within the multicast IP range: from 224.0.0.0 to 239.255.255.255. |
| Bit mask | 8-bit mask. MSB fist Bits 07-06: UDP destination address type 0 = broadcast 1 = multicast 2 = unicast Default = 0 = broadcast Note: (1) This must always be available. Bit05: Auto data send: Meter start to send the synchrophasor data automatically after meter start-up. 0 = disable 1 = enabled Default: 0 = disable Note: (1) This must always be available. Bit04: Broadcast address type: local or global broadcast 0 = local 1 = global Default: 0 = local Note: (1) This must be available only if broadcast is selected for Bits 07-06. Bit03: Service class: 0 = M class 1 = P class Default: 1 = P class local Note: (1) This must always be available. Bit 03-00: unused Modbus Holding Register 7A06H (LSB) |

4.2. Online Screen

There are some of PMU settings that are programmable in PMU dedicated online (meter in run-time mode only) screen in PMU software. The settings in that dedicated online screen is mainly for PMU data format settings. The settings available is described in Table 7 and can be retrieved by a client issuing the Configuration frame command.

TABLE 7

PMU data format settings in online screen

| Modbus Address | Field | Description |
|---|---|---|
| B390H-B397H | Station Name (STN) | Those needs to be displayed gray out and this information will come from meter designation set in device profile |
| B50DH | Nominal Line frequency (FNOM) | Those needs to be displayed gray out and this information will come from IEC 61000-4-30 nominal frequency selection set in device profile |

TABLE 7-continued

PMU data format settings in online screen

| Modbus Address | Field | Description |
|---|---|---|
| AC70H | Data stream ID (IDCODE) | 2 bytes integer<br>Range: 1-65534<br>Default: 1 |
| AC71H | Data format (FORMAT) | 16-bit flag<br>MSB first<br>Bit 15-04: unused<br>Bit 03: FREQ/DFREQ<br>0 = 16-bit integer,<br>1 = floating point<br>Bit 02: ANALOG<br>0 = 16-bit integer,<br>1 = floating point<br>Bit 01: PHASORS<br>0 = 16-bit integer,<br>1 = floating point<br>Bit 00: PHASOR COORD<br>0 = real and imaginary (rectangular),<br>1 = magnitude and angle (polar)<br>Default: 0x000F |
| AC72H-AD51H | Channel names (CHNAM) | 16 bytes in ASCII format for each channel<br>MSB first:<br>Individual Phasors:<br>AC72H-AC79H: Va. Default: "VA Phasor"<br>AC7AH-AC81H: Vb. Default: "VB Phasor"<br>AC82H-AC89H: Vc. Default: "VC Phasor"<br>AC8AH-AC91H: Ia. Default: "IA Phasor"<br>AC92H-AC99H: Ib. Default: "IB Phasor"<br>AC9AH-ACA1H: Ic. Default: "IC Phasor"<br>Symmetrical Components:<br>ACA2H-ACA9H: V 0seq. Default: "V zero seq"<br>ACAAH-ACB1H: V+seq. Default: "V positive seq"<br>ACB2H-ACB9H: V −seq. Default: "V negative seq"<br>ACBAH-ACCIH: I 0 seq. Default: "I zero seq"<br>ACC2H-ACC9H: I +seq. Default: "I positive seq"<br>ACCAH-ACD1H: I −seq. Default: "I negative seq"<br>Analog Values:<br>ACD2H-ACD9H: $W_{TOTAL}$. Default: "Watt Total"<br>ACDAH-ACE1H: $W_A$. Default: "Watt A"<br>ACE2H-ACE9H: $W_B$. Default: "Watt B"<br>ACEAH-ACF1H: $W_C$. Default: "Watt C"<br>ACF2H-ACF9H: $VAR_{TOTAL}$. Default: "VAR Total"<br>ACFAH-AD01H: $VAR_A$. Default: "VAR A"<br>M02H-AD0 9H: $VAR_B$. Default: "VAR B"<br>AD0AH-AD11H: $VAR_C$. Default: "VAR C"<br>AD12H-AD19H: $VA_{TOTAL}$. Default: "VA Total"<br>AD1AH-AD21H: $VA_A$. Default: "VA A"<br>AD22H-AD29H: $VA_B$. Default: "VA B"<br>AD2AH-AD31H: $VA_C$. Default: "VA C"<br>AD32H-AD39H: $PF_{TOTAL}$. Default: "PF Total"<br>AD3AH-AD41H: $PF_A$. Default: "PF A"<br>AD42H-AD49H: $PF_B$. Default: "PF B"<br>AD4AH-AD51H: $PF_C$. Default: "PF C"<br>Digital Status:<br>(Digital Channel Names comes from Device Profile-not settable here)<br>Notes: (1) Strings must be right padded with spaces (20 h) when enter less than 16 bytes.<br>(2) The software will make the channels available for editing depending on the data report selected in "Bit mask" (AD8BH below).<br>(3) For digital input channels, those needs to be displayed gray out and this information will come from high-speed digital input name, set in device profile. |
| AD52H | PMU data rate (DATA_RATE) | 2 bytes integer<br>Range: If the nominal frequency is 50 Hz, it can be either 10, 25 or 50 only.<br>If the nominal frequency is 60 Hz, it can be either 10, 12, 15, 20, 30 or 60 only.<br>Default: 10 |
| AD53H-AD6AH | Phasor conversion factor (PHUNIT) | 4 bytes unsigned integer<br>Range 0-4, 294, 967, 295<br>Least significant bytes: an unsigned 24-bit word in $10^{-5}$ V or $10^{-5}$ A per bit to scale 16-bit integer data<br>MSW first<br>Individual Phasors:<br>Word 11: Va. Default: 0x000186A0 = 100000 [$10^{-5}$ V]<br>Word 10: Vb. Default: 0x000186A0 = 100000 [$10^{-5}$ V] |

TABLE 7-continued

PMU data format settings in online screen

| Modbus Address | Field | Description |
|---|---|---|
| | | Word 09: Vc. Default: 0x000186A0 = 100000 [$10^{-5}$ V]<br>Word 08: Ia. Default: 0x000186A0 = 100000 [$10^{-5}$ A]<br>Word 07: Ib. Default: 0x000186A0 = 100000 [$10^{-5}$ A]<br>Word 06: Ic. Default: 0x000186A0 = 100000 [$10^{-5}$ A]<br>Symmetrical Components:<br>Word 05: V0. Default: 0x000186A0 = 100000 [$10^{-5}$ V]<br>Word 04: V1. Default: 0x000186A0 = 100000 [$10^{-5}$ V]<br>Word 03: V2. Default: 0x000186A0 = 100000 [$10^{-5}$ V]<br>Word 02: I0. Default: 0x000186A0 = 100000 [$10^{-5}$ A]<br>Word 01: I1. Default: 0x000186A0 = 100000 [$10^{-5}$ A]<br>Word 00: I2. Default: 0x000186A0 = 100000 [$10^{-5}$ A]<br>Note: (1) This must be available only if "PHASORS" "Data Format"<br>(Bit 01 in AC71H) is 0 = 16-bit integer.<br>(2) This must be available for editing only if the respective<br>data is available for report (defined in "Bit mask"). |
| AD6BH-AD8AH | Analog conversion factor (ANUNIT) | 4 bytes unsigned integer<br>Range 0-4, 294, 967, 295<br>Least significant bytes: an unsigned 24-bit word in $10^{-5}$ V or $10^{-5}$ A<br>per bit to scale 16-bit integer data<br>MSW first<br>Analog Values:<br>Word 15: $W_{TOTAL}$. Default: 0x00000001 = 1<br>Word 14: $W_A$. Default: 0x00000001 = 1<br>Word 13: $W_B$. Default: 0x00000001 = 1<br>Word 12: $W_C$. Default: 0x00000001 = 1<br>Word 11: $VAR_{TOTAL}$. Default: 0x00000001 = 1<br>Word 10: $VAR_A$. Default: 0x00000001 = 1<br>Word 09: $VAR_B$. Default: 0x00000001 = 1<br>Word 08: $VAR_C$. Default: 0x00000001 = 1<br>Word 07: $VA_{TOTAL}$. Default: 0x00000001 = 1<br>Word 06: $VA_A$. Default: 0x00000001 = 1<br>Word 05: $VA_B$. Default: 0x00000001 = 1<br>Word 04: $VA_C$. Default: 0x00000001 = 1<br>Word 03: $PF_{TOTAL}$. Default: 0x00000001 = 1<br>Word 02: $PF_A$. Default: 0x00000001 = 1<br>Word 01: $PF_B$. Default: 0x00000001 = 1<br>Word 00: $PF_C$. Default: 0x00000001 = 1<br>Note: (1) This must be available only if "ANALOG" "Data Format"<br>(Bit 02 in AC71H) is 0 = 16-bit integer.<br>(2) This must be available for editing only if the respective<br>data is available for report (defined in "Bit mask"). |
| AD8BH | Bit mask | 16 bit mask.<br>MSB fist<br>Bit 15-04: unused<br>Bit 03-00: Data Report Selection<br>Bit 03: Digital Status<br>0 = Disabled<br>1 = Enabled<br>Bit 02: Analog Values<br>0 = Disabled<br>1 = Enabled<br>Bit 01: Symmetrical Components<br>0 = Disabled<br>1 = Enabled<br>Bit 00: Individual Phasors<br>0 = Disabled<br>1 = Enabled<br>Default: 0x0001<br>Note: Report must always have "Individual Phasors" (Bit 00)<br>set to 1 = Enabled. |

The setting in Table 3 is mapped into a block of Modbus holding register (which address range is AC70H-AD8BH), called here just "settings block".

The settings block has a related checksum, which can be retrieved via Modbus holding register AD8CH and is used to test the settings block integrity. That checksum is computed over the entire settings block using CRC-16 with 0xA001 as polynomial representation. When the settings block is updated, its checksum needs to be written into this same Modbus holding register.

Besides the settings block there is the "synchrophasor online settings update status" register (or just STS Register) on address AD8DH. This register contains flags (in its least significant byte) that are essential to the settings update process and a countdown clock (in its most significant byte) with the remaining time for the update taking place. The flags involved can be described as "Update Failed" (01H), "Update In-Progress" (02H), "Locked to Update" (08H) and "Locked this Connection" (or simply "Locked to Me") (04H). More details on each flag meaning can be found below.

Status (STS) Modbus Holding Register, AD8DH, MSB first

LSB, Byte 0: Status byte

| | |
|---|---|
| xxxxxxx0b: Success | = Latest data block update success/data valid. |
| xxxxxxx1b: Fail | = Latest data block update failed |
| xxxxxx0xb: Done | = Data block is being used by the meter |
| xxxxxx1xb: Progress | = Data block update in progress, it is going to be replaced soon check the timeout counter |
| xxxx00xxb: Unlock | = Data block unlocked/free to update |
| xxxx10xxb: Lock to someone else | = Data block lock to update by another user |
| xxxx11xxb: Lock to me | = Data block lock to update by the same connection |

MSB, Byte 1: Timeout counter

Figure 12:
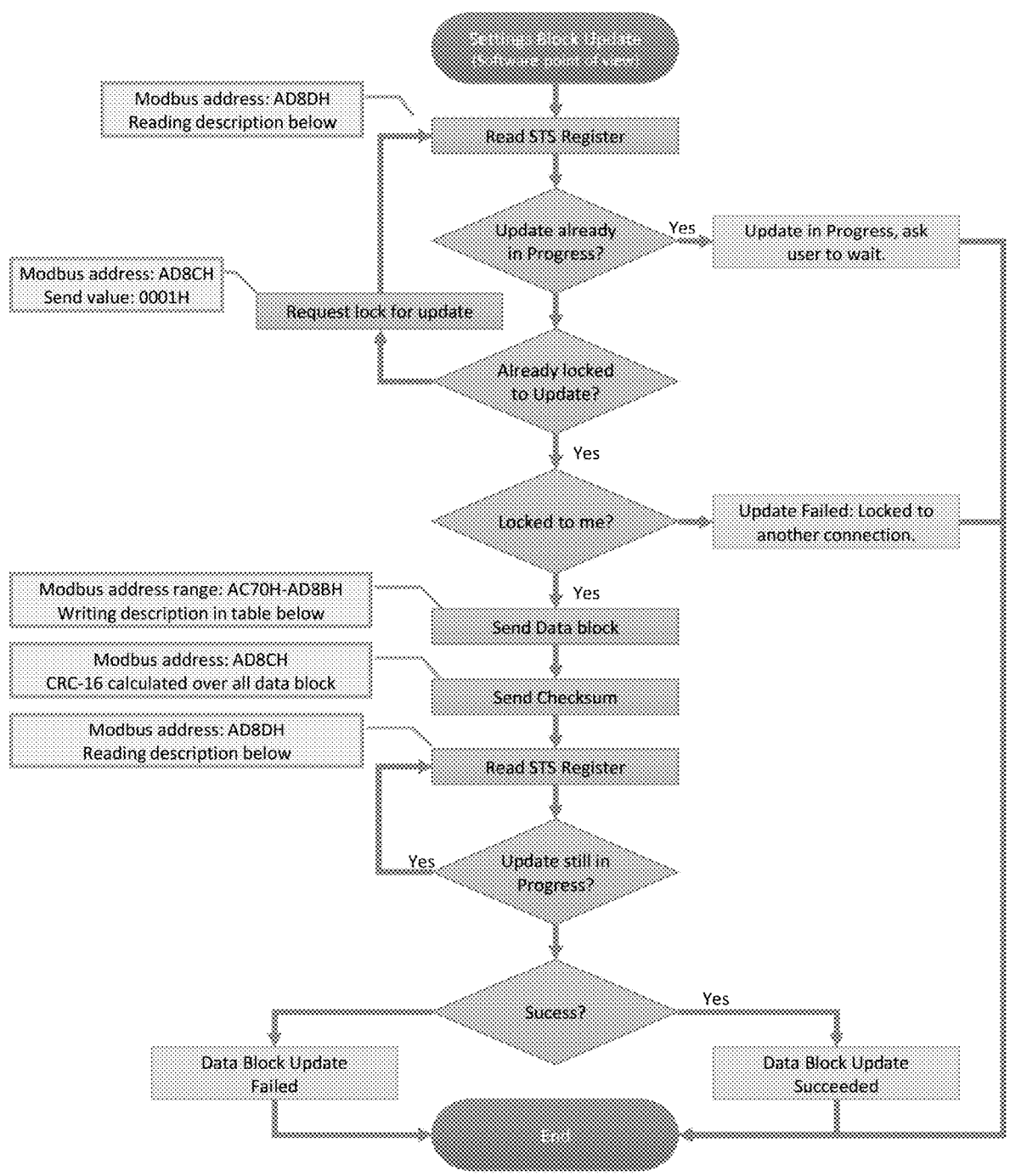
FIG. 12 is a flow chart illustrating a method for updating a data block according to an embodiment of the present disclosure.

0x00: Timeout, data block replaced
0x01-0x3C: Number of seconds remained before data block been replaced
0x3D-0xFF: reserved To begin the update, the software must request the block to update by writing 0001H to the STS Register. The meter keeps internally an ID for the connection that made this request to compare it in the next time the STS Register is read and properly set the flag "Locked to Me". This lock (and ID) has a timeout of 1 minute in case an update is not done. To ensure the success of the procedure, the settings block might be retrieved from the meter right after the update to repopulate the settings on the screen. This process is described in FIG. 12, which contains the flowchart from the software point of view.

Figure 13:
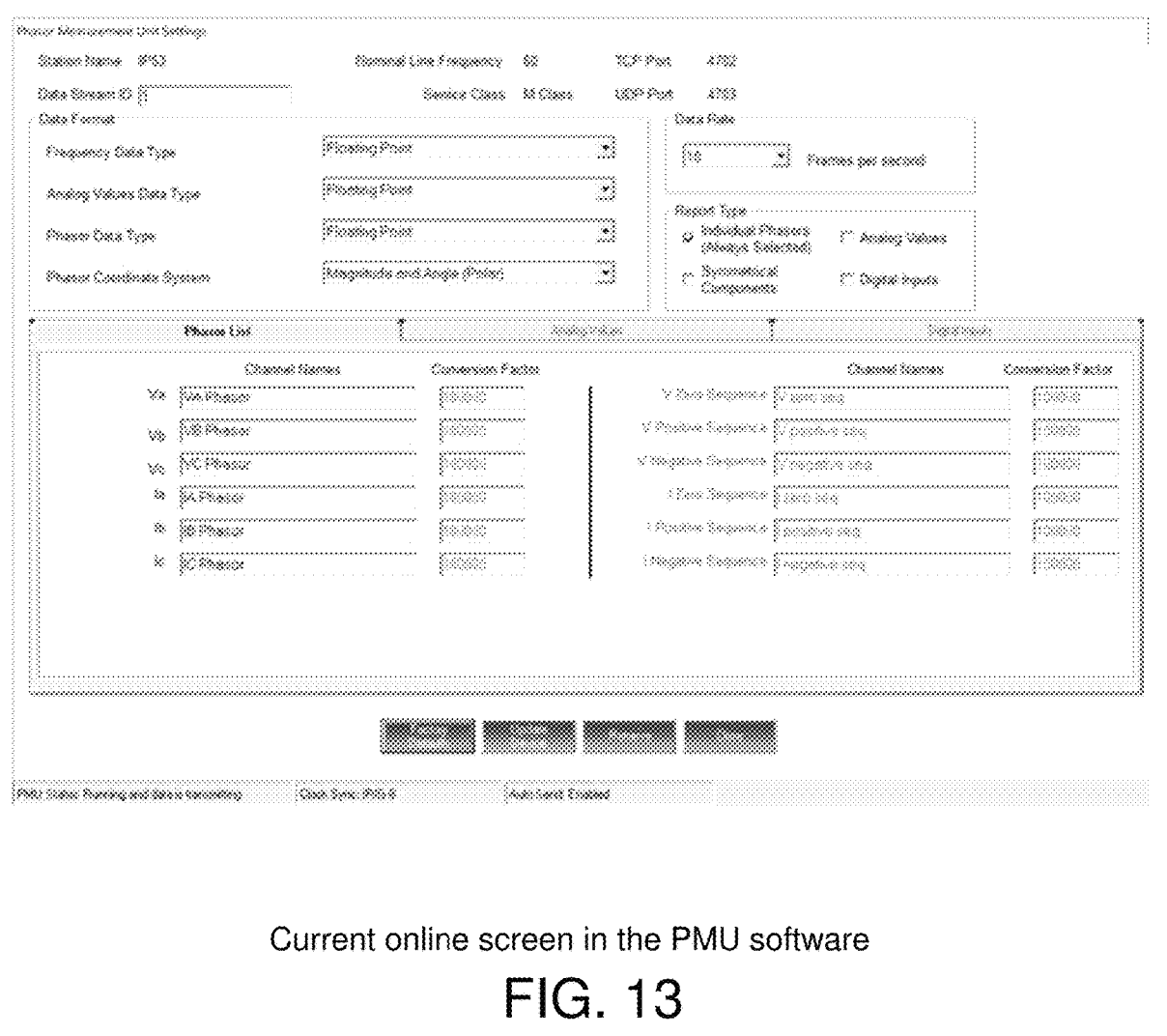

The current online screen available in the PMU software is shown in FIG. 13. When the screen in FIG. 13 is opened, the software will populate all settable fields with values retrieved from PMU. The software will display some of communication settings, as ready only, such as, service class, PMU TCP/UDP port and auto send. The software will make available a "Retrieve" button to be able to read the current settings block inside the PMU. The software will make available an "Update Device" button to be able to apply changes done by user. When the user presses that button, the update process will begin as described in FIG. 12. The entire settings block will be written at once. The software will pop up a screen indicating the remaining time for the PMU starting to use the new settings. The time stablished in the standard for the new settings takes effect in PMU is one minute. The information when the new settings is used by PMU is provided within the data frame then warning the client that a requesting of the configuration would be necessary to be able to interpret the data frame. The software will make available a "Close" button that will close the online screen. The software will make available a "Factory Defaults" button that will populate all settable settings to default value as described in Table 7. The software will provide error message when PMU is prevented to be working properly. For example, in the screen capture below, it was configured line sync as time synchronization and disabled PMU, then the online screen will warn the user that the PMU is not running. The software provides in the bottom a bar some status information based on the information provided by the Modbus Holding register AD8EH: PMU Status Modbus Holdine Register, ADSEH, MSB First Bit 15-08: DSP to PowerPC synchrophasor data update counter. If this counter did not increment, then PMU did not have data update otherwise it has data update Bit 07-03: Undefined Bit 02: DSP to PowerPC synchrophasor data update status: This bit should change 0 to 1 every cycle (60 Hz/50 Hz), the counter above should be incremented when this bit is set to 1

0=data do not update
    1=data update

Bit 01: PMU TX data status:
    0=no data is being transmitted
    1=data is being transmitted Bit 00: PMU status:
    0=Not running/Disabled
    1=Running/Enabled The PMU of the present disclosure may be employed in a synchrophasor system. The synchrophasor system of the present disclosure uses high speed phasor readings taken from multiple locations on the electrical grid and synchronized to a highly accurate time source. In such a system, the synchrophasors are used to analyze electrical grid performance. They provide wide-area situational awareness for system operators, giving them tools to adjust and improve power stability, e.g., by letting them: determine stress points in the transmission system; view phase divergence in different parts of the system; detect islanding and address power system weaknesses to ensure reliable power.

Figure 14:
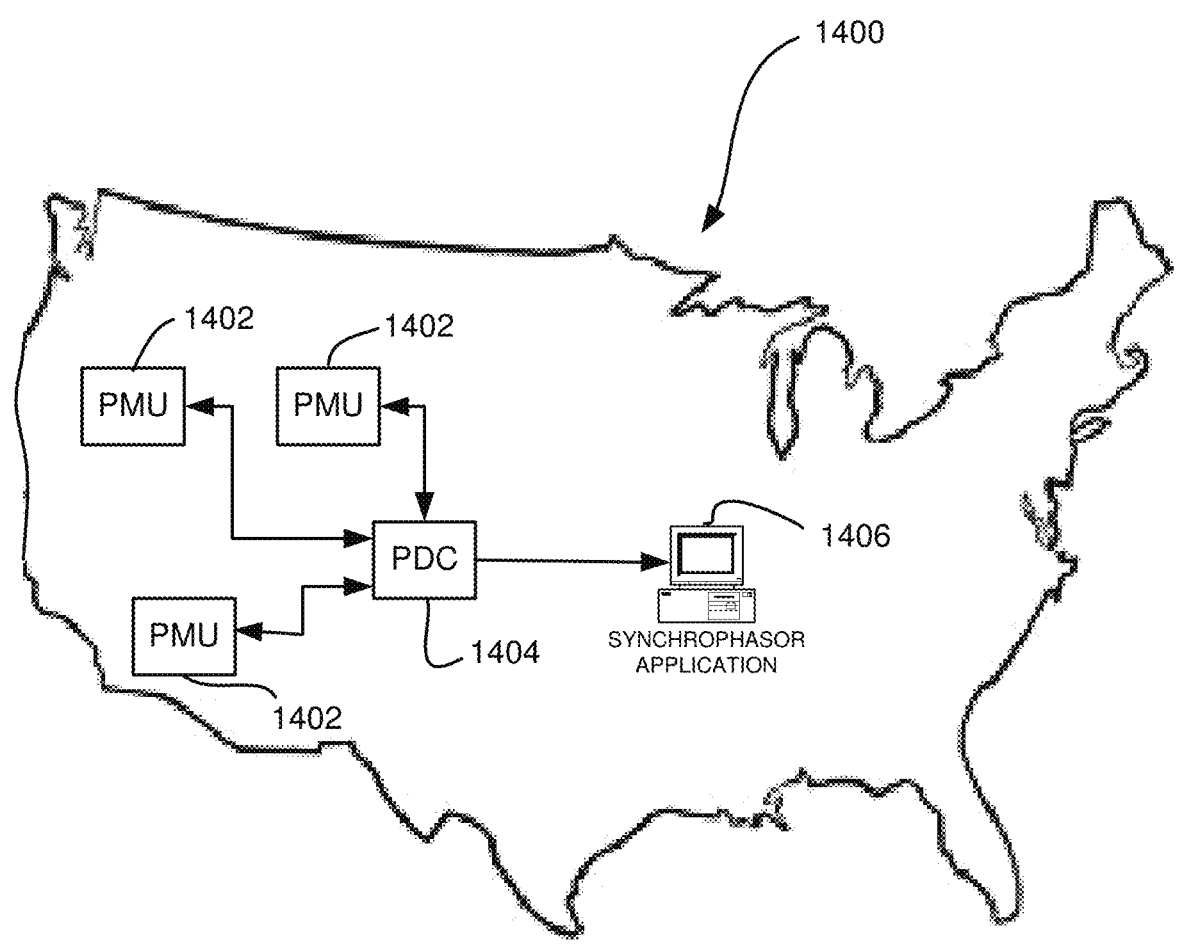
FIG. 14 illustrates a synchrophasor system according to an embodiment of the present disclosure.

The synchrophasor system 1400 of the present disclosure includes multiple phasor measurement units (PMUs) 1402, one or more phasor data concentrators (PDCs) 1404, a communication framework for transmitting data and a control, monitoring, or visualization application 1406, as shown in the FIG. 14. It is to be appreciated that the communication framework may include any communications network, e.g., the Internet, by any means, for example, a hardwired or wireless connection, such as dial-up, hardwired, cable, DSL, satellite, cellular, PCS, wireless transmission (e.g., 802.11a/b/g), etc. The network may be a local area network (LAN), wide area network (WAN), the Internet or any network that couples a plurality of computers to enable various modes of communication via network messages. Furthermore, the communication framework may include the power distribution system where messages, data, etc. are transmitted via the power lines by a power line communication protocol.

From its specific location on the electrical grid, each PMU 1402 estimates phasor (magnitude and phase angle of voltage and current) and related data that is accurately synchronized to a common time source. The time-synchronized estimated phasor is called a synchrophasor. Multiple PMUs 1402 transmit the synchrophasors and related data to a PDC 1404, which aggregates and time-aligns the data for real time and post analysis. Local PDCs 1404 receive data from multiple PMUs 1402 inside a substation, and another PDC, referred to as the SPDC, receives the data from multiple local PDCs.

Figure 15:
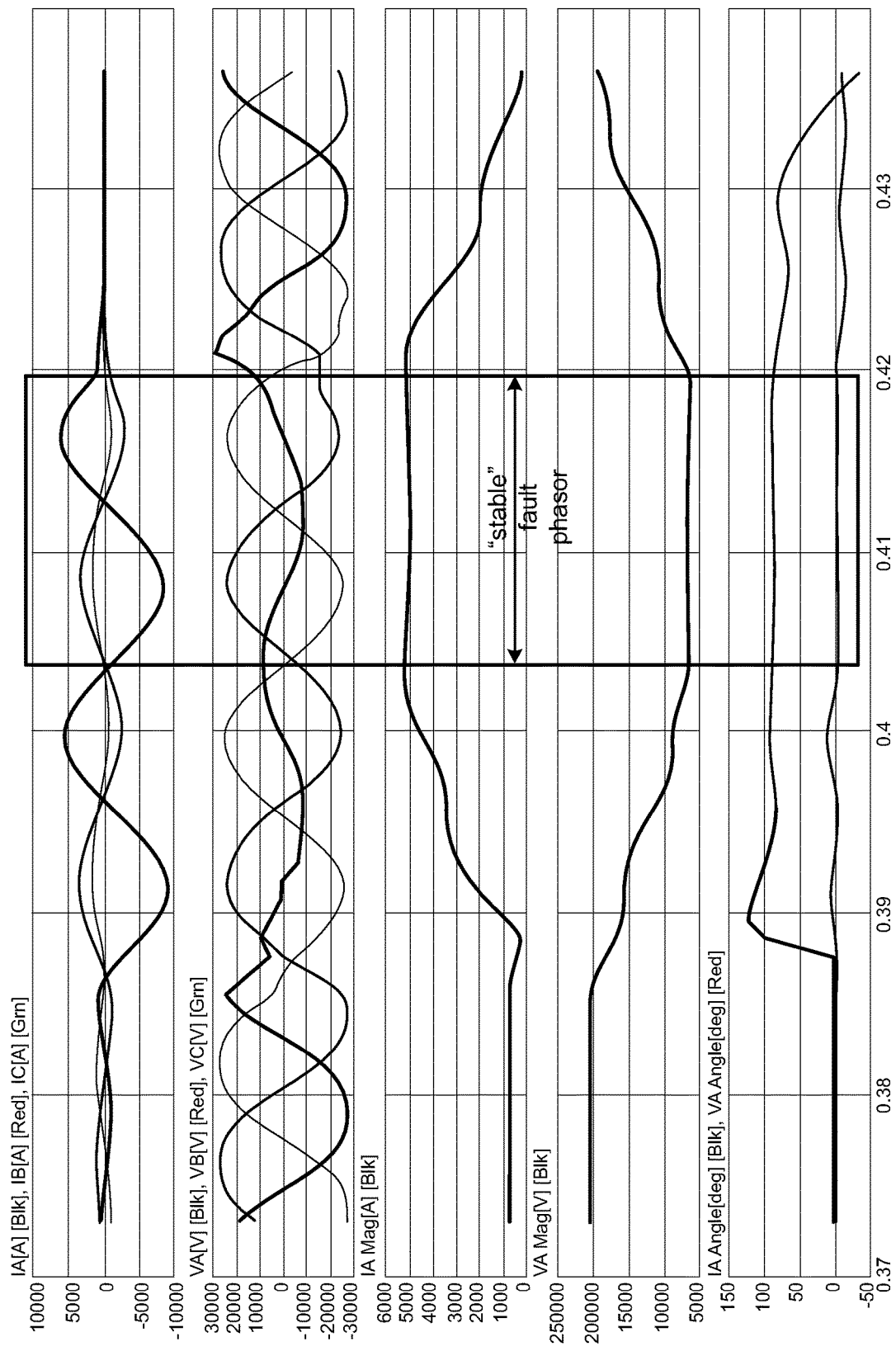
FIG. 15 illustrates P class synchrophasors according to an embodiment of the present disclosure.

The PMU of the present disclosure may stream or capture two classes of synchrophasors. These classes are known as:

The P Class or Protection Class Synchrophasors—this class utilizes a 2-cycle "triangular" data filtering window. Given the small window size, a synchrophasor or two can be computed during most fault cases and subsequently be used in a double or triple ended fault location (see FIG. 15). P Class synchrophasors can be emitted at rates of 120 measurements/sec or higher.

Figure 16:
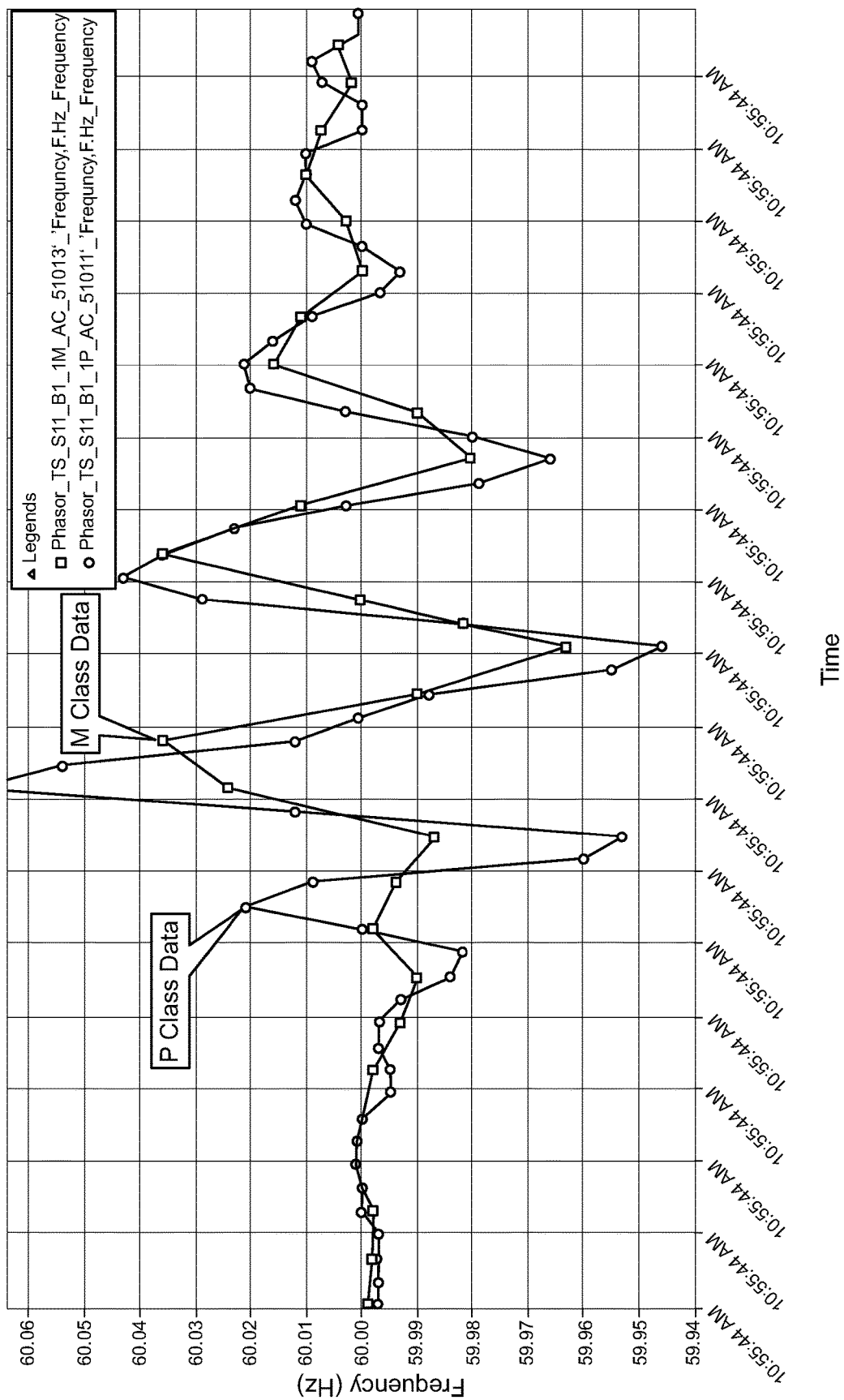
FIG. 16 illustrates P and M class synchrophasors data comparison according to an embodiment of the present disclosure.

The M Class or Measurement Synchrophasors—the M Class synchrophasor integrates sample values over a 7-cycle window. Additionally, the M Class provides a bandpass filter to eliminate frequency components around the nominal frequency. With such a large integration window, an M-Class Synchrophasor will not see fault quantities. Moreover, the M-Class measurements will tend to "average" over the fault window. The M Class can be emitted at rates up to 60 measurements per second. FIG. 16 shows a sample comparison of IEEE C 37.118.1 "P" and "M" class data for 120 frames and 60 frames per second, respectively, from field measurements.

In secure installations in which data communication is only allowed outbound, the PMU may automatically transmit the message Configuration Frame and then start streaming data, immediately on startup. This is configurable through a setting in the PMU device. Any change in configuration will result in the setting of the Configuration Change flag in the streaming message, a re-transmission of the Configuration Frame containing the changed data, and a restart of data streaming.

It is to be appreciated that the PMU of the present disclosure supports either TCP (packet re-transmission on failure to acknowledge) or UDP (no re-transmission on lost packets).

As the electrical grid becomes more complex and more based on inverter sources of power, its fragility increases. An example of this is a recent frequency disturbance in California that resulted in over a Giga-Watt of inverters taking themselves offline. A 99 kV line in Southern California had tripped and this resulted in a power outage in the southern part of the state. Synchronized measurements of the event enabled rapid analysis of the causes of the outage.

The tripping of a line connected to a generator can cause the acceleration of the generator into instability. Being able to monitor the acceleration of the generator, allows a system operator to detect the incipient over-speed and take corrective action immediately, before the problem escalates. Synchrophasor measurements enable such monitoring. Some benefits of the synchrophasor system of the present disclosure are reliability, constraint relief, stability, and post-event analysis.

Some of the reliability benefits are:
Situational awareness—the data streamed by a synchrophasor system provides wide-area visibility of the electrical grid which can't be matched by systems such as SCADA, which can't supply the high-speed dynamic measurements that PMUs can.
Early warning of instability—monitoring the synchrophasor data provides advance warning of power system stability issues.
Oscillation detection—low frequency oscillation threatens the reliability of the electrical grid. Synchrophasor data analysis can determine if oscillation exists on the grid, if it will negatively impact the grid, and the location and type of oscillation1.
Synchrophasor data enables post-event analysis, which in turn leads to better planning to address, and steps to mitigate, power system events.
Islanding recovery—when a distributed generator delivers power to a location that is no longer being powered by the electrical grid, an islanding condition has occurred. Synchrophasors enable detection of islanding that leads to quick response to address this critical and unsafe (for both people and machinery) situation.

One of the constraint relief benefits is:
Improved congestion management—congestion occurs when areas of the grid are receiving less power than they should. Synchrophasors help to detect and address this situation by providing the data needed to determine the cause of the congestion, as well as helping system operators to integrate renewables, such as wind power, into the grid to provide additional sources of power.

The stability benefits are:
Voltage stability—maintaining stable voltage after a grid disturbance is essential to avoid cascading failure. Synchrophasor data provides real time monitoring of the grid that gives system operators the information they need to maintain voltage stability and prevent the grid disturbance from becoming a catastrophic power outage.
Impact of renewables on grid stability, specifically visibility of wind and solar interconnection-synchrophasor data provides both real time monitoring of frequency and detection of oscillation and low damping conditions.

The system analysis benefits include:
Post-event analysis—in addition to real time data, the synchrophasor data is extremely useful post-event, for conducting forensic analysis.
Model validation—e.g., impact of renewables on the electrical grid. The ability of synchrophasors to provide high-speed and localized data make them ideal for power system model validation studies. These models are important for utilities' long-term planning.

It is to be appreciated the PMU of the present disclosure is a fully functional power quality meter acting as a PMU that provides real time synchrophasor outputs. Features of the meter's PMU functions include:
Provides the following data:
Individual voltage/current phasors (VA, VB, VC, IA, IB, IC)
Symmetrical components phasors (V0, V1, V2, I0, I1, I2)
Frequency
ROCOF (Rate of change of frequency)
Built-in high-speed digital inputs
Analog:
Fundamental Power:
Watt total and per phase
VA total and per phase
VAR total and per phase
Displacement power factor: total and per phase
Supports both P and M classes
Data Frame Rates for 50 Hz: 10/25/50 frames per second; for 60 Hz: 10/12/15/20/30/60 frames per second.
Data Format: Configurable Float or Integer, Polar or Rectangular
Time Sync Standard: IRIG-B or IEEE 1588 PTPv2
Supports Ethernet or Fiber over Ethernet, with:
TCP communication for header, configuration, and command UDP communication for data, including unicast, broadcast, and multicast Number of Sessions: Up to two clients can communicate with the meter/PMU at one time, i.e., send requests or commands via TCP. In Unicast mode only, up to two clients can receive the PMU data via UDP.

Supports auto-sending of data upon startup.

As mentioned above, the PMU of the present disclosure is a fully functional power quality meter acting as a PMU, in that regard, the PMU of the present disclosure may employ the components described above, for example, in relation to FIG. 2, to determine power quality events in the electrical distribution system as well as perform revenue metering. It is to be appreciated that the components described in FIG. 2 above may have additional functionality such as that shown and described in commonly-owned U.S. Pat. No. 11,366,143 (U.S. application Ser. No. 14/503,512) and U.S. Pat. No. 11,366,145 (U.S. application Ser. No. 14/249,898), the contents of which are hereby incorporated by reference. For example, U.S. Pat. No. 11,366,143 illustrates in FIGS. 1 and 2 sensors, A/D converters, DSPs, FPGA, a CPU, PowerPC and a communication device. The functionality described in U.S. Pat. No. 11,366,143 for these components may be included in the commonly named components shown in FIG. 2 of the present application. Likewise, U.S. Pat. No. 11,366,145 illustrates in FIGS. 1A and 3A-3B sensors, A/D converters, DSPs, FPGA, a CPU, PowerPC and a communication device. The functionality described in U.S. Pat. No. 11,366,145 for these components may be included in the commonly named components shown in FIG. 2 of the present application.

5. Fundamental Frequency Computation

All frequencies computation described here are based on the high-resolution frequency ($Freq_{HR}$) computation. All frequencies are computed over the fundamental frequency. The fundamental frequency will be extracted by using either regular or customized pass band filter (BPF) over the primary voltage input channel. The customized filter adjusts its parameters based on nominal frequency ($Freq_{nom}$), service class and FPS. The frequency value from the customized filter is only used when it is detected interharmonic interference. Refer to Table 8 below for the in-band frequency and delay for each filter.

TABLE 8

In-band range and delay for the pass band filter

| Filter Type | Nominal Frequency | Class | FPS | In-band | Delay |
|---|---|---|---|---|---|
| Customized | 60 Hz | P/M | 10 | 57.7 Hz~62.3 Hz | No |
| | 60 Hz | P/M | 12 | 57.3 Hz~62.7 Hz | |

TABLE 8-continued

In-band range and delay for the pass band filter

| Filter Type | Nominal Frequency | Class | FPS | In-band | Delay |
|---|---|---|---|---|---|
| | 60 Hz | M | 15 | 56.7 Hz~63.3 Hz | |
| | 60 Hz | M | 20 | 55.7 Hz~64.3 Hz | |
| | 60 Hz | M | 30/60 | 54.7 Hz~65.3 Hz | |
| | 50 Hz | P/M | 10 | 47.7 Hz~52.3 Hz | |
| | 50 Hz | M | 25/50 | 44.7 Hz~55.3 Hz | |
| Regular | 50 Hz/60 Hz | P/M | 10/12/15/25/30/50/60 | 45 Hz~65 Hz | 1192 samples |

5.1. Based on Regular Band Pass Filter $Freq = Freq_{HR}$.

This frequency is updating every half cycle.

This frequency will be default to nominal frequency ($Freq_{nom}$) if its value is either bigger than 70 Hz or less than 40 Hz.

$Freq_{prv}$

This is the Freq before its update $Freq_{inst} = Freq$

This frequency is updating every cycle at rising zero crossing $Freq_{inst-prv}$ This is the $Freq_{inst}$ before its update $$Freq_{inst-avg} = \frac{(Freq_{inst} - Freq_{prv})}{2}.$$

$$Freq_{inst-Iavg} = \frac{\sum_{k=1}^{60}(Freq_{isnt-avg})_k}{60}.$$

$$Freq_{inst-Iavg2} = \frac{\sum_{k=1}^{57}(Freq_{isnt-avg})_k}{57}.$$

$$Freq_{inst-smooth} = \frac{\sum_{k=1}^{4}(Freq_{isnt-avg})_k}{4}.$$

5.2. Based on Customized Band Pass Filter $Freq_{inst}^* = Freq_{HR}$.

This frequency is updating every cycle at rising zero crossing This frequency will be default to nominal frequency ($Freq_{nom}$) if its value is either bigger than 70 Hz or less than 40 Hz.

$$Freq_{inst-avg}^* = \frac{\sum_{k=1}^{60}(Freq_{inst}^*)_k}{60}.$$

$$Freq_{inst-smooth}^* = \frac{Freq_{inst-smooth}^* * 9 + Freq_{inst-avg}}{10}$$

The selection of the frequency to be reported will be based on some scenarios described in the Table below.

TABLE 9

DFT parameters and frequency based on transitory scenario

| | | | DFT | | | | | |
|---|---|---|---|---|---|---|---|---|
| State | Scenario | Class | Start index | End index | Number of Cycles | $\phi_b$(degree) | When | SPFreq |
| 0 | Normal/Static Operation | M | PEAK index − 1 cycle | PEAK index + 1 cycle | 2 | 0 | Report$_{cycle}$ time | Freq$_{inst-smooth}$ |

TABLE 9-continued

DFT parameters and frequency based on transitory scenario

| | | | DFT | | | | | |
|---|---|---|---|---|---|---|---|---|
| State | Scenario | Class | Start index | End index | Number of Cycles | $\phi_b$(degree) | When | SPFreq |
| 1 | Normal/Static Operation | P | PEAK index − 1 cycle | PEAK index + 1 cycle | 2 | 0 | Report$_{cycle}$ time | Freq$_{inst\text{-}smooth}$ |
| 2 | XRMs < 73 v | M | ZC index − 1 cycle | ZC index | 1 | $\dfrac{360 * SP_{freq} * (\text{PEAK index} - \text{ZC index})}{f_s}$ | ZC time | Freq$_{inst\text{-}lavg}$ |
| 3 | XRMs < 73 v | P | ZC index − 1 cycle | ZC index | 1 | $\dfrac{360 * SP_{freq} * (\text{PEAK index} - \text{ZC index})}{f_s}$ | ZC time | Freq$_{inst\text{-}lavg}$ |
| 4 | Interharmonic interference | M only | ZC index − 12 cycles | ZC index | 12 | $\dfrac{360 * SP_{freq} * (\text{PEAK index} - \text{ZC index})}{f_s}$ | ZC time | Freq$_{inst\text{-}smooth}^{*}$ |
| 5 | Long-term Transitory | P/M | PEAK index − 1 cycle | PEAK index + 1 cycle | 2 | 0 | Report$_{cycle}$ time | |
| 6 | Short-term Transitory | P/M | PEAK index − 1 cycle | PEAK index − 1 cycle | 2 | 0 | Report$_{cycle}$ time | Freq$_{inst\text{-}lavg2}$ |
| 7 | Long-term Transitory | P/M | PEAK index − 1 cycle | PEAK index | 1 | 0 | Report$_{cycle}$ time | |

High Resolution Frequency

Define Modbus registers (F6F4H-F6F5H Holding Register) to expose the 1-cycle measurement of the frequency that is updated every ½ cycle.

The resolution of the frequency should be better than 10 mHz. This resolution will be achieved by counting fractional time samples at the zero crossing by interpolating the samples at the zero crossings using the voltage measurements at each side of the zero crossings. Modbus TCP reads of the frequency point shall be possible every 20 ms.

Define Modbus Register (F6F4H-F6F5H Holding Register) to expose a rolling average of the frequency measurement over the last X measurements where the measurements are updated every H cycle.

The value of X shall be settable through a writeable Modbus Register (F6F3H). The range shall be from 4 to 20. Any value less than 4 is default to 4 and any value bigger than 20 is default to 20.

Modbus TCP reads of the frequency point shall be possible every 20 ms.

Figure 17:
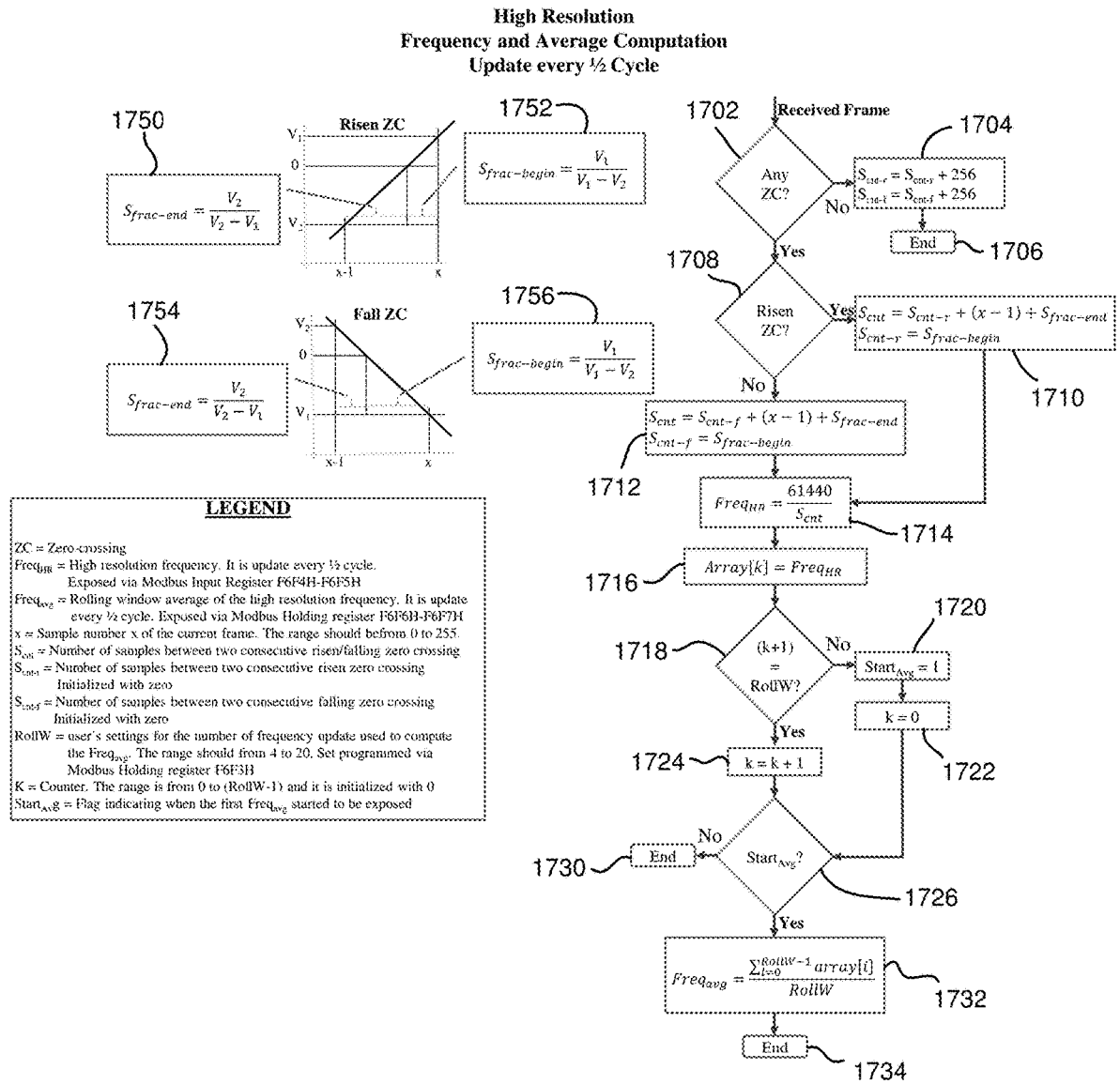
FIG. 17 is a flow chart illustrating a method for computing high resolution one-cycle frequency according to an embodiment of the present disclosure.

Referring to FIG. 17, a method for computing high resolution frequency is illustrated. The method is evaluated every frame update. In each frame update, 256 samples of the input are checked to see if there exists any zero crossing (i.e., rises or falls), in step 1702. It is to be appreciated that the primary input is voltage VA. In case there is no voltage VA, then the method uses voltage VB. If there is no voltage VA and voltage VB, then the method uses voltage VC to compute the frequency. If no zero-crossing happened in the current frame update, then a counter, which contains a partial number of samples between zeros crossing, is incremented by 256 samples, in step 1704. It is to be appreciated that there is a counter for risen zero crossings, i.e., $S_{cnt\text{-}r}$, and other for falling zero crossings, i.e., $S_{cnt\text{-}f}$. If a zero crossing happens in the current frame, the method checks if the zero crossing is a risen or falling zero crossing, in step 1708. If a risen zero crossing happens, then the total number of samples between zeros crossing is computed doing a summation of partial counter from step 1704 plus the current integer number of samples before the zero crossing (x−1) plus the fraction of sample (Sfract-end 1750) to gets the zero crossing, step 1710. The risen counter is re-initialized with a fraction of sample (Sfract-begin 1752). If a falling zero crossing happens, then the total number of samples between zeros crossing is computed doing a summation of partial counter from step 1704 plus the current integer number of samples before the zero crossing (x−1) plus the fraction of sample (Sfract-end 1754) to gets the zero crossing, step 1712. The falling counter is re-initialized with a fraction of sample (Sfract-begin 1756). In step 1714, the 1-cycle high resolution is update by doing the division of 61440 with the value obtained in either step 1710 or step 1712. For example, the sampling frequency is 61440 samples per second: at 60 Hz the number of samples is 1024 (Scnt) samples per cycle or at 50 Hz the number of samples is 1228.8 (Scnt) samples per cycle. This frequency is updating every half cycle because it is update either when risen or falling zero crossing happens. In step 1716, the update of the 1-cycle high resolution frequency is saved inside an array at kth position and the array should contain at least RollW updates. In step 1718, it is verified if the array contains at least RollW updates. If the array contains at least RollW updates in step 1718, the array index is incremented, in step 1724, then the high-resolution frequency average can start to be computed, in step 1726. If the array does not contain at least RollW updates in step 1718, the Start$_{avg}$ flag is set to 1, in step 1720, and the array index is cleared, step 1722. The Frequency average (Freqavg) is computed by the division of the summation of the last previous RollW high-resolution frequency update with RollW update, in step 1732.

6. PTP Operation

Precision Time Protocol (PTP) is a distributed time protocol. It is a MASTER/SLAVE (a.k.a Server/Client) protocol where the MASTER gets the current TOD (Time of Day) from another source such as IRIG, SNTP, GPS etc. and sends it to any SLAVE listening for PTP packets.

There are various types of clocks:
Grandmaster Clock—Ultimate source of time in a domain (grouping of clocks, which synchronize to each other using PTP).

Master Clock—Source of time on a path.

Slave Clock—Receives and maintains time from a master or grandmaster.

Transparent Clock—Switch or hub which performs hardware time stamping and inserts delay in switch/hub in the correction field of the SYNC or FOLLOW UP message.

Boundary Clock—Clock with multiple PTP ports in a domain. It may act as a MASTER and/or a SLAVE. One port is connected to another domain to get/send time from one network to another.

Ordinary Clock—Clock (MASTER or SLAVE) with a single port.

In one embodiment, the PTP is available through an Ethernet option card (also known as a communication device) via twisted pair (TP) or fiber. This option card contains a chip, aka called "PHY" chip. This chip integrates PTP functionalities that it is used by the firmware running in PowerPC(Comm) runtime, which implements PTP slave/master application. The device driver is a code of that firmware that communicates with that PHY. Access to PTP registers in that PHY can be done via two interfaces: MDIO and MII. The meter's clock synchronization via PTP is done by firstly synchronize the PHY clock (See FIG. 19) and then synchronize the meter's clock (See FIG. 22)

The PMU is an end device, so it can be an ordinary clock with single port to either receive or send a PTP packet then from the list above it can be only either slave or master but not both simultaneously.

The packets sent between the MASTER and SLAVE will now be described in relation to FIG. 18. All times in PTP packets are in TAI (International Atomic Time).

The MASTER sends an ANNOUNCE messages to let the SLAVE know the difference between UTC (Coordinated Universal Time) and TAI times where UTC=TAI−offset. The master also sends SYNC messages at consistent intervals. Those SYNC messages are multicast message and any slave on the network can listen it. The PTP MASTER can also be configured to send a FOLLOW UP message, which has the exact time the SYNC message is passed to the driver.

The DELAY REQ/REQ messages are used by the SLAVE to measure transmit delay times through the network to adjust the TOD received from the MASTER to get a more accurate time.

All PTP packets are sent to multicast and port numbers over UDP (User Datagram Protocol) sockets. The port numbers and multicast addresses are specified below. These messages are sent via multicast so any SLAVE on the LAN can coordinate with the time. In one embodiment, a port number for each message type exists. Event messages, which are time critical, uses port 319, and general messages uses port 320.

ANNOUNCE Message: Message ID 11 (0BH)
This packet is sent by the MASTER to SLAVE. See FIG. 18. It contains the offset from UTC to TAI times. It also contains information the slave uses to choose the BMC to use (see FIG. 20).
The UDP packet is sent to the multicast address 224.0.1.129 over port 320 (0140H).
SYNC Message: Message ID 0 (OOH)
This packet is sent by the MASTER to SLAVE. See FIG. 18. It sends the TAI TOD to SLAVE along with other information about the master clock.
The UDP packet is sent to the multicast address 224.0.1.129 over port 319 (13FH).
FOLLOW UP: Message ID 8 (08H)
This packet is sent by the MASTER to SLAVE. See FIG. 18. It sends the TAI TOD that the last SYNC packet was sent by the MASTER
The UDP packet is sent to the multicast address 224.0.1.129 over port 320 (140H).
DELAY REQ: Message ID 1 (01H)
This packet is sent by SLAVE to the MASTER in response to a SYNC or FOLLOW UP message. See FIG. 18
The UDP packet is sent to the multicast address 224.0.1.129 over port 319 (13FH).
DELAY RESP: Message ID 9 (09H)
This packet is sent by the MASTER to the SLAVE. See FIG. 18. The DELAY REQ/DELAY RESP messages are used by the SLAVE to calculate the network delay to adjust the TOD.
The UDP packet is sent to the multicast address 224.0.1.129 over port 320 (140H).

Figure 18:
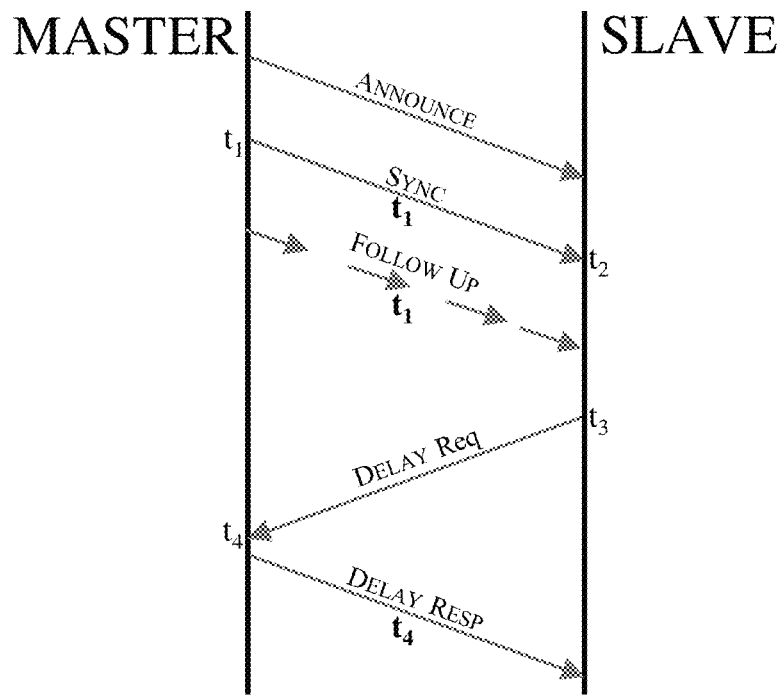
FIG. 18 illustrates a message summary method between a master and slave according to an embodiment of the present disclosure.

In FIG. 18, the following times are defined as $t_1$=TOD SYNC message sent by MASTER $t_2$=TOD SYNC message received by SLAVE $t_3$=TOD DELAY REQ request sent by SLAVE $t_4$=TOD DELAY RESP request by received MASTER If path delay calculation is configured (CFG_DELAY_REQ_RESP), then the DELAY REQ and DELAY RESP messages will be sent. The four times (t1, t2, t3, t4) are used to calculate the path delay.

The formula used to calculate the Offset from master is shown below. It is assuming that the path delay is the same in both direction $$t2 = t1 + \text{path delay} + \text{Offset from master}$$

$$t4 = t3 + \text{path delay} - \text{Offset from master}$$

$$\text{Master to slave delay} = t2 - t1$$

$$\text{Slave to master delay} = t4 - t3$$

$$PD = \text{Path Delay} = \left(\frac{(t2-t1)+(t4-t3)}{2}\right)$$

The path delay is calculated each time a DELAY RESPONSE (T4) is received. The path delay of the current T1, T2, T3 and T4 values are calculated and saved. After 8 path delays have been saved, after each DELAY RESPONSE is received, the last 8 path delays are averaged to get the Mean Path Delay. In other words:

$$MPD = \text{Mean path delay} = \frac{\sum_{i=1}^{8} PD_i}{8}$$

Where from PD1 to PD8 are the last 8 consecutive path values defined above

Offset from master=master to slave delay−mean path delay

In all modes, the ANNOUNCE and SYNC packets are sent. In One-Step mode, the SYNC message and not the FOLLOW UP message is sent by the MASTER. There is a Two-Step flag in the flags field of the SYNC message which indicates if the FOLLOW UP message will be sent. The flag will be set to 0 for One-Step mode. If CFG_SEND_MSG_FOLLOW_UP is set to 0 then One-Step mode will be implemented by the MASTER. If the MASTER does hardware timestamping, it does not need to do Two-Step mode as the PHY puts the time in the packet when it is sent out. In Two-Step mode both SYNC and FOLLOW UP messages are sent by the MASTER. There is a Two-Step flag in the flags field of the SYNC message which indicates if a FOLLOW UP message will be sent. The flag will be set to 1 for Two-Step mode. The FOLLOW UP message specifies the time the SYNC packet was transmitted by the device driver. If CFG_SEND_MSG_FOLLOW_UP is set to 1 then Two-Step mode will be implemented by the MASTER.

PHY (Ethernet Physical Layer)

6.1. PHY Clock

The PHY clock consists of 32-bits of seconds and 32-bits of nanoseconds (although not all 32-bits of nanoseconds are needed). The PHY clock is kept in TAI time. Two interfaces exist to read/write the clock: MDIO (Management data input/output) and MII (Media independent access).

There are three ways to set the clock via the PTP PHY registers:

Set clock—Sets the clock directly; done at initialization or if Step Adjustment cannot be done Step Adjustment—Adjusts time when modifying clock by less than 1 second When the SLAVE receives the SYNC packet, it has all the information it needs to modify the PHY clock based upon time information received from the MASTER. The PHY chip give the option to just adjust the clock instead of setting the clock. Adjusting the clock is much faster than setting the clock. The amount of time the clock is adjusted is the offset from MASTER as described above. This process is called a Step Adjustment. There is one exception for which it is necessary to set the time instead of doing a step adjustment. If the adjustment time is one second or more (positive or negative) then the clock must be set instead of adjusted. In other words, the clock can only be adjusted by nanoseconds.

Rate Adjustment—Adjust frequency of the clock

The clock can be set up to operate at an adjusted frequency. This can be permanent or temporary rate adjustment. This allows for correction on the order of $2^{-32}$ per reference cycle. This adjustment will allow the clock to correct the offset over time due to side-effects of step adjustment. This method is used when the clock's time are very close.

Timestamps

The four time values (t1, t2, t3, t4) in the FTP packets (see FIG. 18) are set by the PHY when timestamping is enabled (e.g., CFG_SLAVE_PTP_TIMESTAMP_HW_LAYER and CFG_MASTER_PTP_TIMESTAMP_HW_LAYER). Timestamping may be enabled for better performance.

There are two options for receiving timestamps besides the ones which are already stored in the time field of the packet (see t1 and t4 below). One option is the device can capture up to four timestamps when a PTP Event Message is received. The second option, which is implemented in the firmware, is to store the time in the reserved and correction fields of the FTP packet.

Summary of times in FTP packets:

t1=time MASTER sends SYNC message is timestamped by the MASTER; this is stored in the time field in the SYNC packet by the MASTER PHY t2=time SLAVE receives the SYNC packet. This value is stored in the correction field of the SYNC packet and is set by the PHY on the SLAVE t3=time DELAY REQ is sent; it is stored in the incoming DELAY RESP in the correct field by the SLAVE's PHY t4=time DELAY RESP is sent by the MASTER; it is stored by the MASTER's PHY in the outgoing time field in the DELAY RESP packet The timestamps are either stored in the time field or the correction field (see above).

PTP Slave 6.2. Initialization

Generally, both the MASTER and SLAVE code will be turned on (e.g., INCLUDE_PTP_MASTER and INCLUDE_PTP_SLAVE), however, only one can be run at a time. Either CFG_RUN_PTP_MASTER or CFG_RUN_PTP_SLAVE (or neither) will be set to 1 to indicate which protocol is to be run. Setting both to one is an invalid configuration.

FTP Slave initialization involve setting/clearing variables used by the slave and sets up FTP PHY registers to initialize the PHY clock and setup register to do timestamping.

Figure 19:
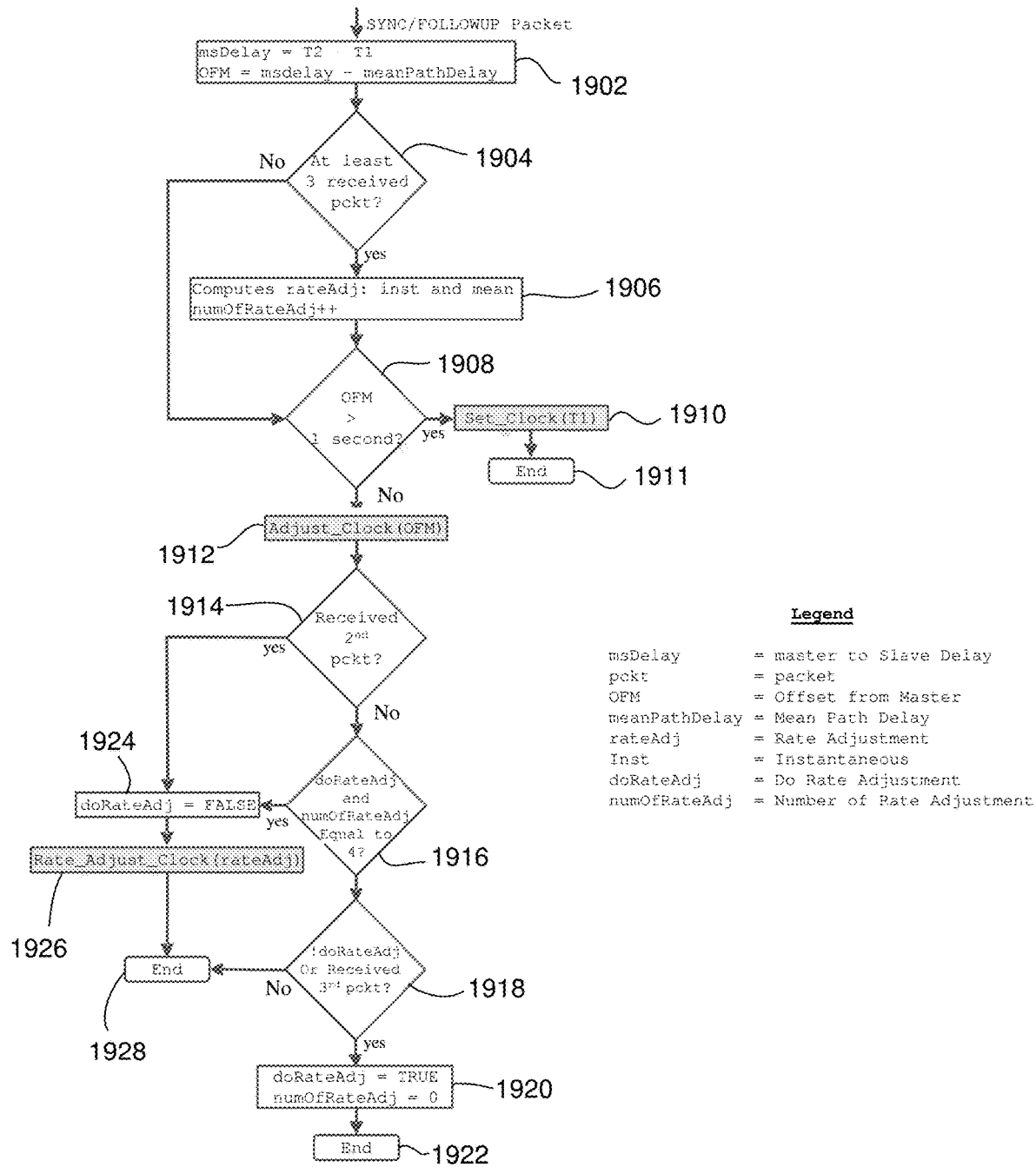
FIG. 19 is a flow chart illustrating a method for setting a PHY clock according to an embodiment of the present disclosure.

The FTP SLAVE sets the internal timer in the PHY of IEEE 1588 chip (PHY clock) on the meter based upon the received time and any delays etc. It calls the routine ptp_slave_update_clock (which will be depending upon the offset from the master do a:

step adjustment and possibly a rate adjustment call eig_ptp_clock_set( ) in ptp.c to set the PHY clock during initialization or if jump in time (slave offset from master) is more than one second 6.3. Setup PHY Clock The Slave will set PHY time, adjust PHY time and do a rate adjustment of the PHY clock. The algorithm which specifies which actions to take is described in relation to FIG. 19. FIG. 19 describes how the PHY clocks gets synchronized with the FTP master clock by using set clock, step and/or rate adjustments. The set clock is a gross adjustment and is only used when the offset from master (OFM) is more than 1 second. On the other hand, when the offset from master is less than a second the step adjustment is applied for fine adjustment. The rate adjustment is done periodically to adjust the PHY clock frequency to correct offset (OFM) over time.

In step 1902, the slave receives a SYNC/FOLLOWUP packet and determines a master to slave delay (msDelay) and an offset from master (OFM). In step 1904, the slave determines if at least 3 packets are received, and if affirmative, computes a rate adjustment (rateAdj) including instantaneous (inst) and mean rate adjustment and the number of computed rates adjustment (numOfRateAdj), in step 1906. In step 1908, if the OFM is greater than 1 second, the PHY clock is set, in step 1910, and the process ends in step 1911. If the OFM is not greater than 1 second, the PHY clock is adjusted by the OFM in step 1912.

In step 1914, the slave determines is a $2^{nd}$ packet is received. If a $2^{nd}$ packet is received, the first rate adjustment is performed at step 1926 and is forced to not do this rate adjust again at least for the next 4 coming packets by setting doRateAdj to false, in step 1924. Then, the process ends at step 1928.

If a $2^{nd}$ packet is not received in step 1914, another rate adjustment will occur only when in step 1916, the salves determines that both doRateAdj is set to true and the number of computed rates adjustment (numOfRateAdj) is 4.

If doRateAdj is set to false or the number of computed rates adjustment (numOfRateAdj) is not 4 in step 1916 then in step 1918, the slave determines when the next rate adjust will occur by checking doRateAdj and if the $3^{rd}$ packet is received. If either doRateAdj is false or a $3^{rd}$ packet is received then at step 1920, doRateAdj is set to true and numOfRateAdj is set to 0, which will force the next rate adjust to happen only after 4 received packets and then the process ends at step 1922; otherwise the rate adjust will occur after at least 3 received packets, and then the process ends at steps 1928.

The following is the algorithm used for rate adjustment:

```
rateDiffn = number of 2^-32ns clock step adj
mstDiffn = 8ns clock period based on the % of error from the master
clock
per clock period
/* ----------------------------- */
mstDiffn = T1 − prv_delta_t1
rateDiffn = mstDiffn − (T2 − prv_delta_t2)
rateadj_inst_hist[0-3] = rateDiffn / mstDiffn
rate_avg = avg(rateadj_inst_hist [0- 3] )
rateadj_avg_hist[ 0-1 ] =
        rate_avg + rateadj;
/* ----------------------------- */
rateadj = avg (rateadj_avg_hist [0-3] )
rateadj = min (rateadj,  3FFFFFFFH) ;
rateadj = max (rateadj, −3FFFFFFFH) ;
/* save for next SYNC Message */
prv_delta_t2 = T2 − offset_from_master
prv_delta_t1 = T1
```

Figure 23:
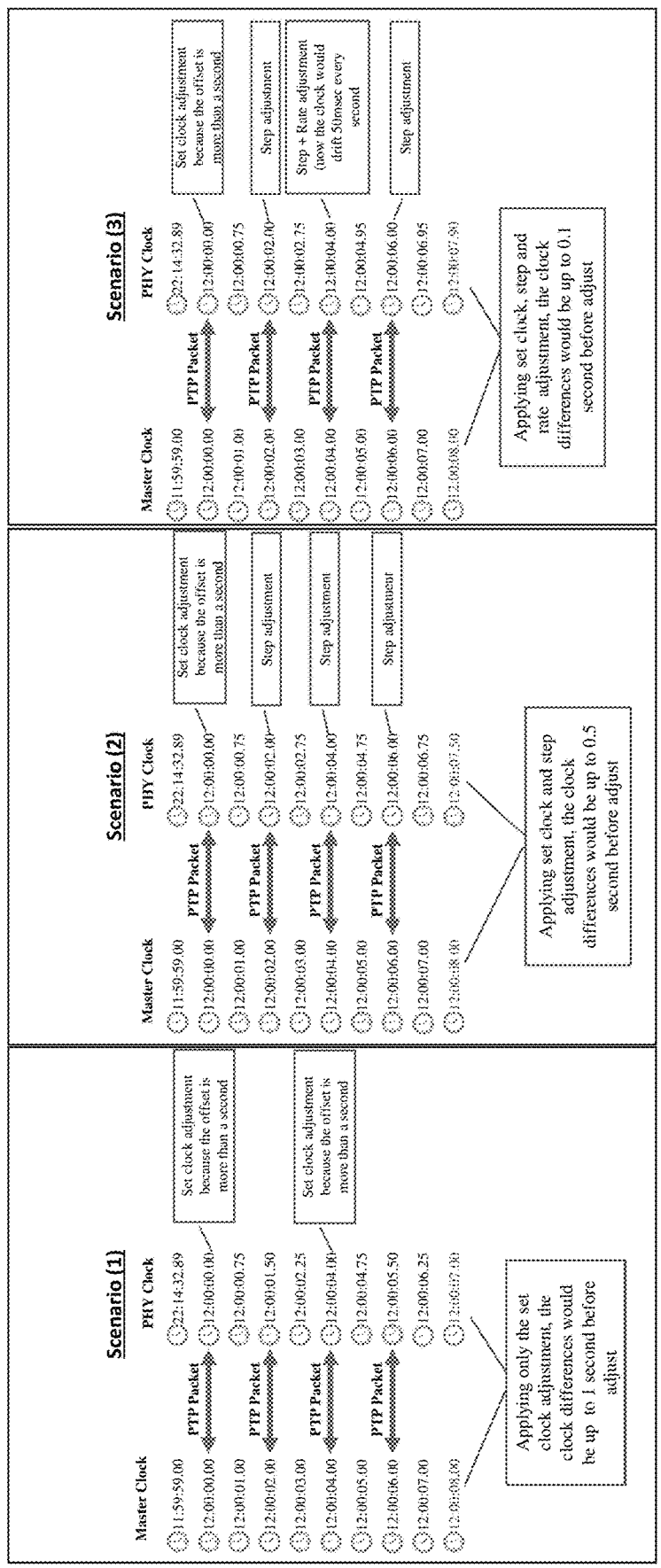
FIG. 23 illustrates various scenarios demonstrating PHY clock synchronization according to an embodiment of the present disclosure.

Referring to FIG. 23, three scenarios for demonstrating the PHY clock synchronization are illustrated where scenario (1) considers just set clock, scenario (2) considers set clock and step adjustments and scenario (3) considers set clock, step and rate adjustment.

6.4. Best Master Clock Algorithm

Figure 20:
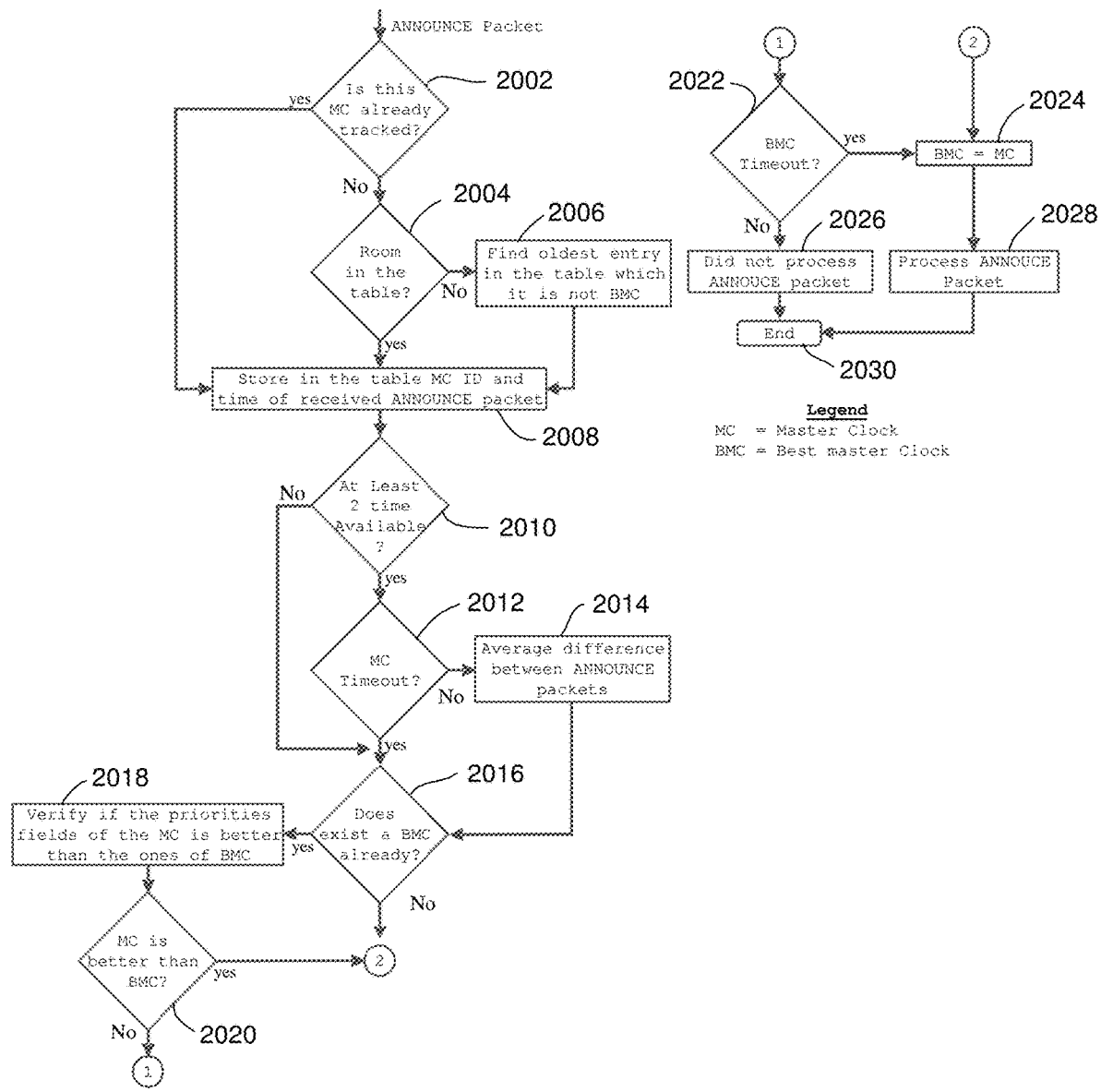
FIG. 20 is a flow chart illustrating a method for selecting the best master clock according to an embodiment of the present disclosure.

It is to be appreciated that there may be more than one master clock on the network. A slave clock must communicate with and use time specified by only one of these master clocks at a time. The slave keeps the Clock ID of the master clock which is the best master clock, so it knows which master clock it is using. The slave picks which master clock is the best master clock when it receives ANNOUNCE packets based upon the Best Master Clock (BMC) Algorithm, as illustrated in FIG. 20.

The BMC algorithm specifies if it has never heard from a master clock (generally this is at initialization) or has not received an ANNOUNCE packet in a configurable amount of time (e.g., MASTER_CLOCK_TIMEOUT_MULTIPLIER and mean time algorithm below), and an ANNOUNCE packet from a master arrives, then this ANNOUNCE packet from the master will specify that this is the best master clock (i.e., the slave IED saves the CLOCK ID from the master clock). If the slave already is communicating with a master and an ANNOUNCE packet comes in, the slave determines if this is a better master clock based upon the follow priorities in descending order:

Priority 1: lower number takes precedence (configured)

Clock Class: the lower number takes precedence

In one embodiment, the clock class, which it is the clock's traceability, is either 6 when it is synchronized to external time source (IRIG-B/SNTP/Line Synch or even a manual time change) or 7 when it is not synchronized to external time source Clock Accuracy: lower number takes precedence In one embodiment, the accuracy is stablished as: 27H (100 μsec), for IRIG-B time synchronization, 29H (1 msec) for SNTP time synchronization, FEH (unknown) for line sync, 2BH when there is not external time synchronization at all.

Offset Scaled Log Variance (configured)

Priority 2: lower number takes precedence (configured)

Clock ID: configured (a list with priority attached to each clock ID is kept)

The slave keeps track of the mean time between ANNOUNCE packets for a maximum number of master priority clock (CFG_MAX_NUM_MASTER_PRIORITY_CLOCK) master clocks. If it is tracking more than this number of MASTER clocks, the slave reuses the oldest master clock (in terms of last time heard from this MASTER clock). The slave never reuses the master clock entry which is the current MASTER clock which SLAVE is using time from. It also keeps an overall mean time for all master clocks which it can use if there have not been enough ANNOUNCE packets from a MASTER which it just started using.

Referring to FIG. 20, in step 2002, the slave device, e.g., an IED, receives an ANNOUNCE packet and determines if this master clock (MC) is already being tracked. If the MC is already being tracked by the slave, the slave stores in a table, e.g., in a memory, the MC ID and the time of the received ANNOUNCE packet, in step 2008. If the MC is not being tracked, the slave determines if there is room in the table, in step 2004, and if affirmative, moves to step 2008. If there is no room in the table in step 2004, the oldest entry in the table which is not the BMC is determined in step 2006, and then the slave stores in a table, e.g., in a memory, the MC ID and the time of the received ANNOUNCE packet, in step 2008.

In step 2010, the slave determines if at least two times are available. If at least two times are available in step 2010, the slave determines if a MC timeout has occurred, in step 2012. It is to be appreciated that the MC Timeout check at step 2012 is done to avoid including a large value in the average computation. If a MC timeout has occurred, the slave will determine if a BMC exists already, in step 2016. If a MC timeout has not occurred, the slave will determine the average difference between ANNOUNCE packets (i.e., meantime), in step 2014. To calculate the meantime or average difference, up to 10 times are kept for each Master Clock tracking. So, if 5 ANNOUNCE packets have been received at times (t1, t2, t3, t4, t5), the average rate of this Master Clock sending ANNOUNCE packets is:

$$\text{Average } \textit{Diff} = \left( \frac{(t5 - t4) + (t4 - t3) + (t3 - t2) + (t2 - t1)}{4} \right)$$

It is to be appreciated that to get one average value to start using, at least two ANNOUNCE packets must have arrived. All MASTER on the LAN should use the same ANNOUNCE packet interval according to IEEE Standard for a Precision Clock Synchronization Protocol for Networked Measurement and Control Systems.

In step 2016, the slave determines if a BMC already exists. It is to be appreciated that during initialization, there is no BMC, so the step 2016 will be false during the initialization and the first MC that gets into the salve at the step 2002 will become the BMC. If a BMC already exists, the slave will verify if the priority fields of the MC is better than the priority fields of the BMC, in step 2018. In step 2020, the slave determines if the MC is better than the BMC, and if the MC is better than the BMC, the BMC is set to the MC in step 2024. In step 2028, the ANNOUNCE packet is processed and, in step 2030, the process ends.

Alternatively, in step 2020, the slave determines if the MC is better than the BMC, and if the MC is not better than the BMC, the BMC timeout is verified in step 2022. If the BMC timeout occurred, the BMC is set to the MC in step 2024. In step 2028, the ANNOUNCE packet is processed and, in step 2030, the process ends. If the BMC timeout has not occurred, the ANNOUNCE packet is not processed, in step 2026, and, in step 2030, the process ends.

If the BMC does not exists in step 2016, the BMC is set to the MC in step 2024. In step 2028, the ANNOUNCE packet is processed and, in step 2030, the process ends.

If an ANNOUNCE packet arrives from a MASTER which is not the BMC (current MASTER using time from), and the SLAVE has not heard from the MASTER via an ANNOUNCE message in the (mean time*MASTER_CLOCK_TIMEOUT_MULTIPLIER), then the SLAVE will switch MASTER to now listen to this new MASTER. A BMC timeout occurs when an ANNOUNCE packet arrives from a clock other than the BMC and an ANNOUNCE packet has not been received from the BMC in more than Average Diff*Master clock timeout Multiplier. This check is done in case a MASTER goes offline then online again so a huge time difference is not averaged in.

PTP Master
6.5. Initialization

PTP Master initialization involves setting/clearing variable including setting the UTC offset (UTC to TAI times offset) which is passed to the SLAVE in the ANNOUNCE message. It also sets up the PTP PHY registers to initialize the PHY clock and setup registers to do timestamping. Two tasks are spawned. One to loop sending ANNOUNCE, SYNC and FOLLOW UP messages at configured intervals. The second task waits on DELAY REQUEST messages and in response sends DELAY RESPONSES. The transmit process in RTIP notes when a SYNC message is sent. When it detects a FOLLOW UP message, it will insert the time the SYNC packet was sent on the wire in the FOLLOW UP message. FOLLOW UP messages are not needed if hardware timestamping is done as the time the SYNC packet is sent is inserted in the packet by the PHY, so timestamping is more accurate than using FOLLOW UP packets. The master sets the PHY clock at initialization based upon the DSP time.

6.6 PTP Time Synchronization

Figure 21:
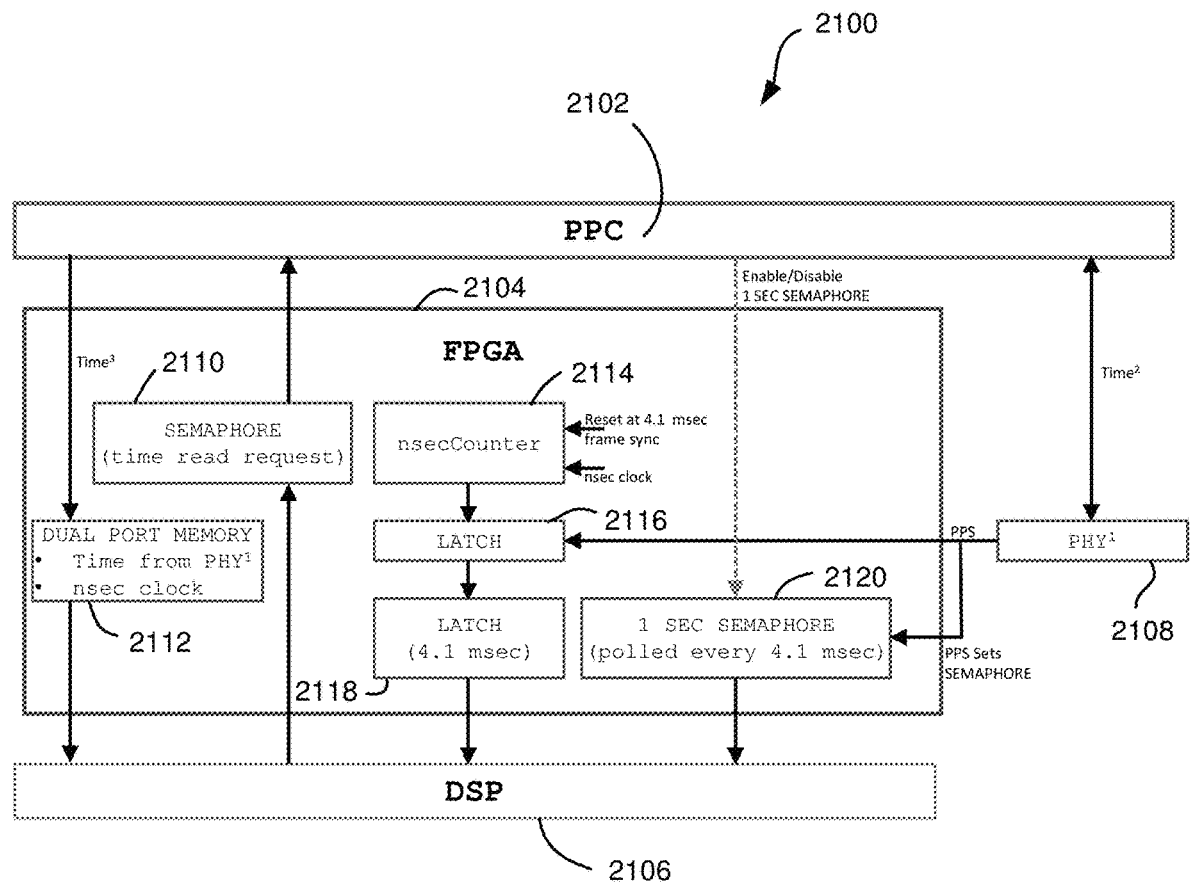
FIG. 21 is a block diagram of a PTP time synchronization circuitry according to an embodiment of the present disclosure.
Figure 22:
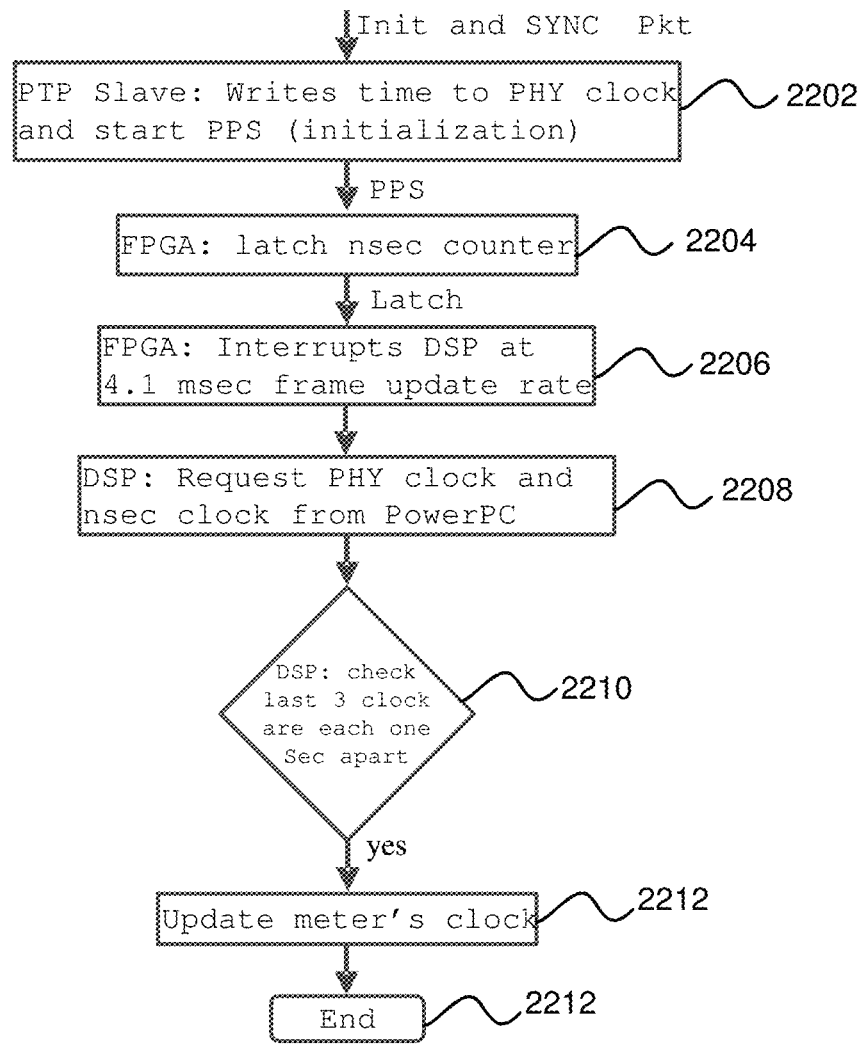
FIG. 22 is a flow chart illustrating a method for updating a meter clock according to an embodiment of the present disclosure.

Next, the engine to synchronize the meter's clock with PTP master will be described. The following description further details method of updating time in the PHY and meter/DSP clocks, where FIG. 21 illustrates the FTP time synchronization circuitry and interfaces and FIG. 22 illustrates the flow diagram.

In step 2202, the FTP SLAVE protocol writes the time to the PHY clock accurately and starts a pre-programmed PPS. The PPS is generated every second on the one second mark. The FPGA 2104 contains a nsec counter 2114, which the nsec counter 2114 is incremented by one every about 10.047 nsec (period of nsec clock). The nsec counter 2114 is cleared at 4.1 msec frame update rate. The FPGA 2104 monitors the PPS and latches the current value of nsec counter when the pulse (PPS) occurs via latch 2216, in step 2204. This gives the precise elapsed time (in nanosec seconds resolution) to the DSP 2106 when the pulse happens. In step 2206, the DSP 2106, on other hand, is interrupted by the FPGA 2104 at frame update rate, to identify when the pulse happens. When it is identified that the pulse happened, the DSP 2106 request through semaphore 2110 to PPC 2102 that the DSP 2106 needs an update of the current time from PHY and nsec Clock inside the dual port memory 2112, step 2208. The FPGA 2104 provides the latched value of the nsecCounter 2118 to DSP 2106.

For the DSP 2106 to be able to synch the meter's clock, in step 2210, the DSP 2106 will be asking for the PHY clock every second and if in the last past 3 seconds, the PHY clock is incremented accordingly, i.e., it is incremented one second every second, the meter's clock gets synchronized, in step 2212. The DSP 2106 will send to PowerPC 2102 a meter's clock update every 4.1 msec

7. Fundamental Power and Displacement Power Factor

Various values that have been described above are shown below with their respective formula to compute same:

| Description | WYE | 2.5 Element WYE | 4 Wire Delta | Delta 2CT/3CT |
|---|---|---|---|---|
| Voltage | | | | |
| Total Harmonic Distortion = $THD_V$ | $THD_{Va}, THD_{Vb}, THD_{Vc}$ | $THD_{Va}, THD_{Vb}, THD_{Vc}$ | $THD_{Va}, THD_{Vb}, THD_{Vc}$ | $THD_{Vab}, THD_{Vcb}$ |
| RMS = V | $V_a, V_b, V_c$ | $V_a, V_b, V_c$ | $V_a, V_b, V_c$ | $V_{ab}, V_{cb}$ |
| Fundamental = $V_1$ | $V_{a1}, V_{b1}, V_{c1}$ | $V_{a1}, V_{b1}, V_{c1}$ | $V_{a1}, V_{b1}, V_{c1}$ | $V_{ab1}, V_{cb1}$ |
| Fundamental Phase = $\beta_1$ | $\beta_{Va1}, \beta_{Vb1}, \beta_{Vc1}$ | $\beta_{Va1}, \beta_{Vb1}, \beta_{Vc1}$ | $\beta_{Va1}, \beta_{Vb1}, \beta_{Vc1}$ | $\beta_{Vab1}, \beta_{Vcb1}$ |
| Current | | | | |
| Total Harmonic Distortion = $THD_I$ | $THD_{Ia}, THD_{Ib}, THD_{Ic}$ | $THD_{Ia}, THD_{Ib}, THD_{Ic}$ | $THD_{Ia}, THD_{Ib}, THD_{Ic}$ | $THD_{Ia}, THD_{Ic}$ |
| RMS = I | $I_a, I_b, I_c$ | $I_a, I_b, I_c$ | $I_a, I_b, I_c$ | $I_a, I_c$ |
| Fundamental = $I_1$ | $I_{a1}, I_{b1}, I_{c1}$ | $I_{a1}, I_{b1}, I_{c1}$ | $I_{a1}, I_{b1}, I_{c1}$ | $I_{a1}, I_{c1}$ |
| Fundamental Phase = $\alpha_1$ | $\alpha_{Ia1}, \alpha_{Ib1}, \alpha_{Ic1}$ | $\alpha_{Ia1}, \alpha_{Ib1}, \alpha_{Ic1}$ | $\alpha_{Ia1}, \alpha_{Ib1}, \alpha_{Ic1}$ | $\alpha_{Ia1}, \alpha_{Ic1}$ |
| Power | | | | |
| Fundamental Active Power = $W_1$ | $W_{a1}, W_{b1}, W_{c1}$ | $W_{a1}, W_{b1}, W_{c1}$ | $W_{a1}, W_{b1}, W_{c1}$ | $W_{11}, W_{21}$ |
| Fundamental Reactive Power = $VAR_1$ | $VAR_{a1}, VAR_{b1}, VAR_{c1}$ | $VAR_{a1}, VAR_{b1}, VAR_{c1}$ | $VAR_{a1}, VAR_{b1}, VAR_{c1}$ | $VAR_{11}, VAR_{21}$ |
| Fundamental Apparent Power = $VA_1$ | $VA_{a1}, VA_{b1}, VA_{c1}$ | $VA_{a1}, VA_{b1}, VA_{c1}$ | $VA_{a1}, VA_{b1}, VA_{c1}$ | $VA_{11}, VA_{21}$ |
| Displacement Power Factor = $PF_1$ | $PF_{a1}, PF_{b1}, PF_{c1}$ | $PF_{a1}, PF_{b1}, PF_{c1}$ | $PF_{a1}, PF_{b1}, PF_{c1}$ | $PF_{11}, PF_{21}$ |

6.5.1.1. Formula $$V_1 = \sqrt{\frac{V^2}{THD_v^2 + 1}}$$

$$I_1 = \sqrt{\frac{I^2}{THD_i^2 + 1}}$$

C. fundamental active power per phase:

$W_1 = V_1 I_1 \cos(\alpha_1 - \beta_1)$

D. fundamental reactive power per phase:

$VAR_1 = V_1 I_1 \sin(\alpha_1 - \beta_1)$

E. fundamental apparent power per phase:

$VA_1 = V_1 I_1$

F. Total fundamental active power:

WYE:$TW_1 = W_{a1} + W_{b1} + W_{c1}$ 2.5 Element WYE:$TW_1 = W_{a1} + W_{b1} + W_{c1}$ 4 Wire DELTA:$TW_1 = W_{a1} + W_{b1} + W_{c1}$

DELTA 2CT/3CT:$TW_1 = W_{11} + W_{21}$

G. Total fundamental reactive power:

WYE:$TVAR_1 = \sqrt{TVA_1^2 - TW_1^2}$ 2.5 Element WYE:$TVAR_1 = \sqrt{TVA_1^2 - TW_1^2}$ 4 Wire DELTA:$TVAR_1 = \sqrt{TVA_1^2 + TW_1^2}$

DELTA 2CT/3CT:$TVAR_1 = VAR_{11} + VAR_{21}$

H. Total fundamental apparent power:

WYE:$TVA_1 = TVA_1 + VA_{a1} + VA_{b1} + VA_{c1}$ 2.5 Element WYE:$TVA_1 = VA_{a1} + VA_{b1} + VA_{c1}$ 4 Wire DELTA:$TVA_1 = \sqrt{TVAR_1^2 + TW_1^2}$ DELTA 2CT/3CT:$TVA_1 = \sqrt{TVAR_1^2 + TW_1^2}$ I. Displacement power factor per phase:

$$TPF_1 = \frac{TW_1}{TVA_1}$$

J. Total displacement power factor per phase:

$$PF_1 = \frac{W_1}{VA_1} = \cos(\alpha_1 - \beta_1)$$

It is to be appreciated that the various features shown and described are interchangeable, that is a feature shown in one embodiment may be incorporated into another embodiment. It is further to be appreciated that the methods, functions, algorithms, etc. described above may be implemented by any single device and/or combinations of devices forming a system, including but not limited to meters, IEDs, servers, storage devices, processors, memories, FPGAs, DSPs, etc.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. A device comprising:
   a voltage input sensor circuit operative to sense line voltage from the AC power system and generate at least one voltage signal representative of the line voltage sensed from the AC power system;
   a current input sensor circuit operative to sense line current from the AC power system and generate at least one current signal representative of the line current sensed from the AC power system;
   a plurality of analog-to-digital converter circuits configured to sample the at least one voltage signal and the at least one current signal to output digital samples representative of the at least one voltage signal and the at least one current signal;
   at least one processor operatively coupled to the plurality of analog-to-digital converter circuits and configured to perform at least one mathematical computation on the digital samples received from the analog-to-digital converter circuits, at least one mathematical computation including determining a magnitude and phase angle of each of the at least one voltage signal and the at least one current signal; and
   a clock for time-stamping the determined magnitude and phase angle, the clock being time synchronized with an external time source.

2. The device of claim 1, where the external source is at least one of an Inter-Range Instrumentation Group-B (IRIG-B) source and/or a Precision Time Protocol (PTP) source.

3. The device of claim 1, further comprising a communication device that transmits the time-stamped magnitude and phase angle over a network.

4. The device of claim 3, where the communication device operates under User Datagram Protocol (UDP).

5. The device of claim 4, wherein the communication device transmits the time-stamped magnitude and phase angle in at least one of a multicast mode, broadcast mode and/or a unicast mode.

6. The device of claim 4, wherein the communication device supports two simultaneous sessions with external client devices.

7. The device of claim 1, wherein the at least one mathematical computation further includes determining at least one of symmetrical components' phasor, frequency, rate of change of frequency, high-speed digital inputs, analog fundamental power and/or displacement power factor.

8. The device of claim 1, wherein the at least one mathematical computation further includes determining at least one power quality event.

9. The device of claim 8, wherein the power quality event includes at least one of a voltage sag, a voltage swell and/or a voltage transient.

10. A device comprising:
   at least one sensor for sensing at least one input voltage and current channel of an electrical distribution system,
   at least one input channel for receiving AC voltages and currents from the at least one sensor including at least one analog to digital converter for outputting digitized signals; and
   a processing system including a field programmable gate array (FPGA) and a digital signal processor (DSP) coupled to the at least one input channel configured to receive the digitized signals, the FPGA configured to capture high speed inputs and synchronize the captured inputs with an external time source and the DSP is configured to determine a magnitude and phase angle of the captured inputs,
   the FPGA further configured to determine a power quality event from the sensed at least one input voltage and current channels.

11. The device of claim 10, wherein the power quality event includes at least one of a voltage sag, a voltage swell and/or a voltage transient.

12. The device of claim 10, further comprising a digital input, and wherein the processing system is configured to receive a signal from the digital input and calculate a state and transition of the digital input.

13. The device of claim 12, wherein the processing system is configured to update the state and transition of the digital input at a peak time event and to report the state and transition of the digital input at a report time event.

14. The device of claim 13, wherein the report time event is offset from the peak time event.

15. The device of claim 10, wherein the processing system is configured to apply a correction factor to calculate the phase angle.

16. The device of claim 15, wherein the correction factor is based on a hardware delay time.

17. The device of claim 15, wherein the correction factor is based on the difference between a zero crossing time event and a peak time event.

18. The device of claim 1, further comprising a digital input, and wherein the at least one processor is configured to receive a signal from the digital input and calculate a state and transition of the digital input.

19. The device of claim 18, wherein the at least one processor is configured to update the state and transition of the digital input at a peak time event and to report the state and transition of the digital input at a report time event.

20. The device of claim 1, wherein the at least one processor is configured to apply a correction factor to calculate the phase angle.

* * * * *